(12) United States Patent
Kim et al.

(10) Patent No.: US 12,342,682 B2
(45) Date of Patent: Jun. 24, 2025

(54) DISPLAY DEVICE AND METHOD OF PROVIDING THE SAME

(71) Applicant: Samsung Display Co., LTD., Yongin-si (KR)

(72) Inventors: Ji Yoon Kim, Seongnam-si (KR); Yool Guk Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 399 days.

(21) Appl. No.: 17/343,888

(22) Filed: Jun. 10, 2021

(65) Prior Publication Data

US 2022/0013603 A1 Jan. 13, 2022

(30) Foreign Application Priority Data

Jul. 10, 2020 (KR) ........................ 10-2020-0085128

(51) Int. Cl.
*H10K 59/122* (2023.01)
*H10K 50/12* (2023.01)
*H10K 50/13* (2023.01)
*H10K 71/00* (2023.01)
*H10K 102/00* (2023.01)

(52) U.S. Cl.
CPC ......... *H10K 59/122* (2023.02); *H10K 50/121* (2023.02); *H10K 50/131* (2023.02); *H10K 71/00* (2023.02); *H10K 2102/351* (2023.02)

(58) Field of Classification Search
None
See application file for complete search history.

(56) References Cited

U.S. PATENT DOCUMENTS

| | | | |
|---|---|---|---|
| 8,670,197 B2 | 3/2014 | Okumoto et al. | |
| 10,186,560 B2* | 1/2019 | Lee | H10K 59/131 |
| 10,600,852 B2 | 3/2020 | Lee et al. | |
| 2011/0261477 A1* | 10/2011 | Okumoto | H10K 59/122 430/7 |
| 2015/0200237 A1 | 7/2015 | Yim et al. | |
| 2017/0141352 A1* | 5/2017 | Shin | G02F 1/133345 |
| 2017/0186831 A1* | 6/2017 | Nam | H10K 50/814 |
| 2018/0337334 A1* | 11/2018 | Kim | B23K 26/402 |
| 2018/0342563 A1* | 11/2018 | You | H10K 71/00 |
| 2019/0288231 A1* | 9/2019 | He | H10K 59/122 |

(Continued)

FOREIGN PATENT DOCUMENTS

| | | |
|---|---|---|
| JP | 2012047764 A | 3/2012 |
| KR | 1020070059971 A | 6/2007 |

(Continued)

*Primary Examiner* — Michelle Mandala
(74) *Attorney, Agent, or Firm* — CANTOR COLBURN LLP

(57) ABSTRACT

A display device includes a substrate, a pixel defining layer defining a first opening, a light emitting element including a first electrode exposed to outside the pixel defining layer by the first opening and a light emitting layer in the first opening and facing the first electrode, and a spacer spaced apart from the pixel defining layer along the substrate. The pixel defining layer and the spacer each includes a top surface which is furthest from the substrate and a height of the top surface from the substrate, and the height of the top surface of the spacer is greater than the height of the top surface of the pixel defining layer.

18 Claims, 14 Drawing Sheets

(56) References Cited

U.S. PATENT DOCUMENTS

2019/0363275 A1* 11/2019 Ochi ................ G09F 9/301
2020/0212364 A1* 7/2020 Kim ................ B32B 27/36

FOREIGN PATENT DOCUMENTS

| KR | 1020090010890 A | 1/2009 |
| KR | 20170104085 A | 9/2017 |
| KR | 20190109680 A | 9/2019 |

\* cited by examiner

10: 101, ATL, SL, 102

DISPLAY DEVICE AND METHOD OF PROVIDING THE SAME

This application claims priority to Korean Patent Application No. 10-2020-0085128 filed on Jul. 10, 2020, and all the benefits accruing therefrom under 35 U.S.C. 119, the contents of which in its entirety are herein incorporated by reference.

BACKGROUND

1. Field

The disclosure relates to a display device and a method of providing the same.

2. Description of the Related Art

The importance of display devices has steadily increased with the development of multimedia technology. Accordingly, various types of display devices such as a liquid crystal display ("LCD") device, an organic light emitting display ("OLED") device and the like have been used.

Among the display devices, a self-light emitting display device includes a self-light emitting element such as an organic light emitting diode. The self-light emitting element may include two opposite electrodes and a light emitting layer which is interposed therebetween. Where the organic light emitting diode is the self-light emitting element, electrons and holes from the two opposite electrodes are recombined in the light emitting layer to produce excitons, which transition from the excited state to the ground state, thereby emitting light.

Such a self-light emitting display device is attracting attention as a next-generation display device since the self-light emitting display device is capable of meeting high display quality requirements such as wide viewing angle, high brightness and contrast, and quick response speed as well as having a low power consumption, light weight and small thickness due to omission of a separate power source.

SUMMARY

One or more embodiment provides a display device having improved height uniformity of a spacer, reducing the number of spacers by increasing an effective area ratio thereof, and suppressing or preventing foreign substance defects that occur during a spacer forming process, and a method of providing the same.

However, embodiments are not restricted to the ones set forth herein. The above and other features of the disclosure will become more apparent to one of ordinary skill in the art to which the disclosure pertains by referencing the detailed description of the disclosure given below.

An embodiment of a display device includes a substrate, a pixel defining layer defining a first opening, a light emitting element including a first electrode exposed to outside the pixel defining layer by the first opening and a light emitting layer in the first opening and facing the first electrode, and a spacer spaced apart from the pixel defining layer along the substrate. The pixel defining layer and the spacer each includes a top surface which is furthest from the substrate and a height of the top surface from the substrate, and the height of the top surface of the spacer is greater than the height of the top surface of the pixel defining layer.

An embodiment of a display device includes a substrate, a semiconductor layer on the substrate, a first insulating layer on the active layer, a gate conductive layer on the first insulating layer, a second insulating layer on the gate conductive layer, a data conductive layer on the second insulating layer, a planarization layer facing the substrate with each of the semiconductor layer, the first insulating layer, the gate conductive layer, the second insulating layer and the data conductive layer therebetween, a pixel electrode on the planarization layer, a pixel defining layer disposed on the planarization layer on which the pixel electrode is disposed, the pixel defining layer defining both a first opening exposing the pixel electrode and a second opening spaced apart from the first opening and the pixel electrode, a light emitting layer facing the pixel electrode which is exposed by the first opening, and a spacer in the second opening and spaced apart from the pixel defining layer. The pixel defining layer and the spacer each includes a top surface which is furthest from the substrate and a height of the top surface from the substrate. The height of the top surface of the spacer from is greater than the height of the top surface of the pixel defining layer.

An embodiment of a method of providing a display device, the method including providing a first electrode of a light emitting element on a substrate, providing a first organic layer on the substrate, the first organic layer covering the first electrode of the light emitting element. providing a spacer by patterning the first organic layer using a first photomask, the providing of the spacer uncovering the first electrode of the light emitting element, after the providing of the spacer and uncovering the first electrode, providing a second organic layer having liquid repellency on the substrate, the second organic layer covering the first electrode and the spacer, and providing a pixel defining layer from the second organic layer by patterning the second organic layer using a second photomask different from the first photomask, the providing of the pixel defining layer including defining both a first exposed region in the pixel defining layer which exposes the first electrode to outside the pixel defining layer, and a second exposed region in the pixel defining layer which exposes the spacer to outside the pixel defining layer, the second exposed region spaced apart from the first exposed region. At the second exposed region, the spacer is spaced apart from the pixel defining layer, the pixel defining layer and the spacer each includes a top surface which is furthest from the substrate and a height of the top surface from the substrate, and the height of the top surface of the spacer is greater than the height of the top surface of the pixel defining layer.

In in or more embodiment of the display device and the method of providing the same, height uniformity of a spacer may be improved to increase an effective area ratio thereof and reduce the number of spacers, thereby suppressing or preventing prevent foreign substance defects that occur during a spacer forming process.

The effects of the invention are not limited to the aforementioned effects, and various other effects are included in the present specification.

BRIEF DESCRIPTION OF THE DRAWINGS

The above and other features of the disclosure will become more apparent by describing in detail embodiments thereof with reference to the attached drawings, in which.

DETAILED DESCRIPTION

Figure 1:
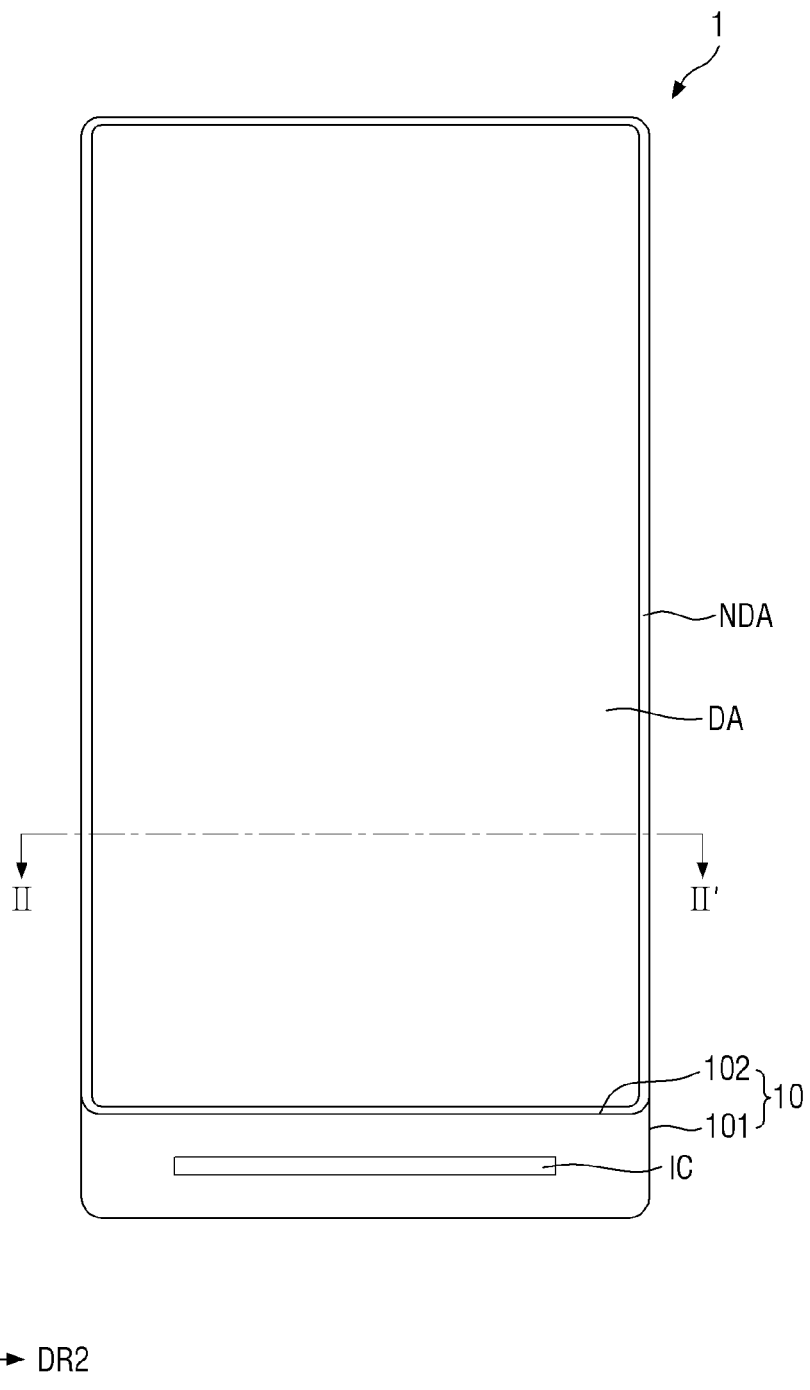
FIG. 1 is a plan view of an embodiment of a display device.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no intervening layer is present.

The same reference numbers indicate the same components throughout the specification. In the attached figures, the thickness of layers and regions is exaggerated for clarity.

Although the terms "first," "second," etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments will be described in detail with reference to the accompanying drawings.

Figure 2:
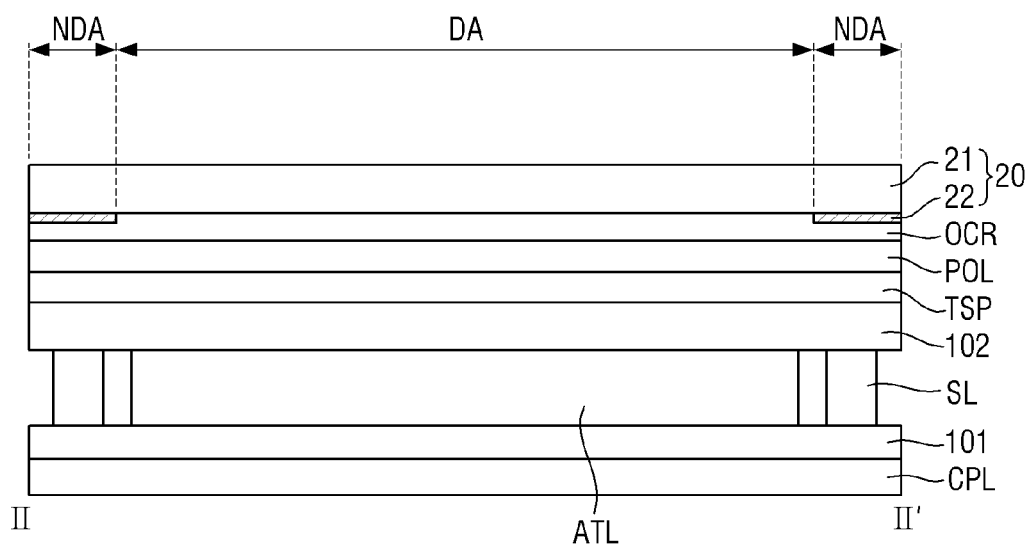
FIG. 2 is a cross-sectional view taken along line II-II' of FIG. 1.
Figure 2:
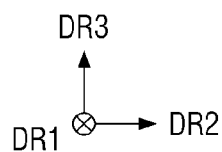

FIG. 1 is a plan view of an embodiment of a display device 1. FIG. 2 is a cross-sectional view taken along line II-II' of FIG. 1. FIG. 2 is a schematic cross-sectional view of an embodiment of a display device 1.

A first direction DR1 and a second direction DR2 represent different directions crossing each other. In an embodiment, for example, the first direction DR1 and the second direction DR2 may be directions crossing at a right angle in the plan view. A third direction DR3 indicates a direction intersecting a plane defined by the first direction DR1 and the second direction DR2 crossing each other. In an embodiment, the third direction DR3 may be a direction perpendicularly intersecting both the first direction DR1 and the second direction DR2. In the plan view, the first direction DR1 indicates a vertical direction of a display device 1, the second direction DR2 indicates a horizontal direction of the display device 1, and the third direction DR3 indicates a thickness direction of the display device 1.

In the following embodiments, a first side of the first direction DR1 refers to an upward direction in the plan view and a second side of the first direction DR1 which is opposite to the first side thereof refers to a downward direction in the plan view. A first side of the second direction DR2 refers to a rightward direction in the plan view, and a second side of the second direction DR2 which is opposite to the first side thereof refers to a leftward direction in the plan view. A first side of the third direction DR3 refers to an upward direction in a cross-sectional view, and a second side of the third direction DR3 which is opposite to the first side thereof refers to a downward direction in the cross-sectional view. In addition, unless otherwise defined, with respect to the third direction DR3, the terms "above," "top surface" and "upper side" as used herein refer to a display side of a display panel 10 at which a display surface is defined, and the terms "below," "bottom surface" and "lower side" as used herein refer to a side opposite to the display side of the display panel 10. It should be understood, however, that a direction mentioned in the embodiment refers to a relative direction and the embodiment is not limited to the directions mentioned.

Referring to FIGS. 1 and 2, a display device 1 displays a moving image or a still image. A main screen display direction may be at the first side of the third direction DR3 (e.g., top emission type display device), but is not limited thereto.

The display device 1 may refer to an electronic device providing a display screen at which an image is displayed. Examples of the display device 1 may include a television, a laptop computer, a monitor, a billboard, an Internet-of-Things device and the like as well as portable electronic devices such as a mobile phone, a smartphone, a tablet personal computer ("PC"), an electronic watch, a smart watch, a watch phone, a mobile communication terminal, an electronic notebook, an electronic book, a portable multimedia player ("PMP"), a navigation device, a game machine and a digital camera, which provide or include a display screen at which the image is displayed.

The display device 1 includes a display area DA and a non-display area NDA which is adjacent to the display area DA. The display area DA may be defined as a planar area at which an image is displayed and which corresponds to the display screen, and the non-display area NDA may be defined as a planar area at which an image is not displayed. When the display device 1 has a touch function, a touch area as a planar area where a touch input is sensed, may overlap or correspond to the display area DA.

The display area DA may include a pixel PX (in FIG. 3) provided in plural including a plurality of pixels PX. A description thereof will be given later.

In an embodiment, the non-display area NDA is disposed around the display area DA. The non-display area NDA may be a bezel area of the display device 1. The non-display area NDA may overlap a printed layer 22 (in FIG. 2) of a window member 20 (in FIG. 2) to be described later.

The non-display area NDA may surround all sides (each of four sides in FIG. 4) of the display area DA. However, the invention is not limited thereto, and the non-display area NDA may be omitted at one or more sides of the display area DA, for example, omitted at an upper side of the display area DA.

In the non-display area NDA, signal lines and/or driving circuits for applying an electrical signal to the display area DA and/or the touch area may be disposed. In an embodiment, a driving chip IC may be disposed in the non-display area NDA. The driving chip IC may include an integrated circuit for driving the display panel 10. The integrated circuit may include an integrated circuit for image display and/or an integrated circuit for a touch member TSP (in FIG. 2). The driving chip IC may be directly mounted in the display panel 10 at a region thereof where a first substrate 101 protrudes further from a second substrate 102 to define an exposed portion of the first substrate 101.

FIG. 2 is a cross-sectional view taken along line II-II' of FIG. 1. Hereinafter, a cross-sectional structure of the display device 1 will be described with reference to FIGS. 1 and 2.

The display device 1 includes a display panel 10 that generates and/or displays an image and provides a display screen of the display device 1, a touch member TSP (e.g., input sensing layer), an anti-reflection member POL, a window member 20, and a cover panel CPL which is disposed below the display panel 10.

The display panel 10 may include an organic light emitting display panel, a micro light emitting diode ("LED") display panel, a nano LED display panel, a quantum dot light emitting display panel, a liquid crystal display panel, a plasma display panel, a field emission display panel, an electrophoretic display panel, an electrowetting display panel and the like. In the following description, an organic light emitting display panel is applied as an example of the display panel 10, but the invention is not limited thereto, and other display panels may be applied within the scope of the same technical ideas.

The display panel 10 may include a first substrate 101, a second substrate 102 facing the first substrate 101, an active element layer ATL and a sealing member SL.

The first substrate 101 may support the active element layer ATL disposed thereon. The first substrate 101 may be generally transparent and have high light transmittance. The first substrate 101 may include, but is not limited to, an inorganic material such as glass and/or quartz, or the like. The inorganic material may include, but is not limited to, e.g., silicon oxide ($SiO_2$). However, without being limited thereto, the first substrate 101 may be a transparent plate or a transparent film.

The second substrate 102 may be disposed to face the first substrate 101 while being spaced apart from the first substrate 101. The second substrate 102 may protect the active element layer ATL from external moisture, air or the like. The second substrate 102 may be generally transparent and have high light transmittance. The second substrate 102 may include, but is not limited to, an inorganic material such as glass and/or quartz or the like. The inorganic material may include, but is not limited to, e.g., silicon oxide ($SiO_2$). However, without being limited thereto, and the second substrate 102 may be a transparent plate or a transparent film.

The active element layer ATL may be disposed between the first substrate 101 and the second substrate 102. The active element layer ATL may be disposed on a top surface of the first substrate 101 which is closest to the window member 20. The active element layer ATL may include a light emitting element and a thin film transistor for driving the light emitting element. The second substrate 102 may be disposed on the active element layer ATL, although not limited thereto. A detailed description of the active element layer ATL will be given later.

The sealing member SL may be disposed between the first substrate 101 and the second substrate 102. In an embodiment, for example, the sealing member SL may be disposed in the non-display area NDA of the display device 1 to surround the display area DA. The sealing member SL may bond the first substrate 101 and the second substrate 102 to each other, and may seal the active element layer ATL together with the first substrate 101 and the second substrate 102. In an embodiment, the sealing member SL may include a frit, but is not limited thereto.

An inner region of the display panel 10, which is defined by the first substrate 101, the second substrate 102 and the sealing member SL, may be disposed between the first substrate 101 and the second substrate 102. The inner region may be in a vacuum state or may be filled with gas or the like. The gas may include, but is not limited to, e.g., inert gas, normal atmosphere or the like. However, the inner region may be filled with not only gas but also a filler or the like.

The touch member TSP may be disposed on the display panel 10. The touch member TSP may sense an input such as a touch input. The touch member TSP may be disposed on a top surface (or one surface) of the second substrate 102 which is closest to the window member 20. The touch member TSP may be provided integrally with the display panel 10 in the form of a touch layer as illustrated in the following embodiment. However, the invention is not limited thereto, and the touch member TSP may be disposed on the display panel 10 in the form of a touch panel or a touch film which is provided as a separate member from the display panel 10 before attachment to the display panel 10. The touch member TSP may include a plurality of touch electrodes. In an embodiment, the touch member TSP may be omitted.

The anti-reflection member POL may be disposed on the touch member TSP. The anti-reflection member POL may be attached in the form of a polarizing film. The anti-reflection member POL polarizes light passing therethrough. The anti-reflection member POL may serve to reduce the reflection of external light from outside the display device 1. However, without being limited thereto, the anti-reflection member POL may be laminated in the form of an anti-reflection layer inside the display panel 10. Where the anti-reflection member POL is inside the display panel 10, the anti-reflection member POL may include a color filter or the like for selectively transmitting light of a specific wavelength. Further, when the touch member TSP is omitted, the anti-reflection member POL may be attached onto the second substrate 102 without the touch member TSP therebetween.

The window member 20 is disposed on the anti-reflection member POL. The window member 20 serves to cover and protect the display panel 10. The window member 20 may include a window substrate 21 and a printed layer 22 which is disposed on the window substrate 21. The window member 20 may be attached onto one surface of the display panel 10 through a transparent bonding layer OCR including an optical clear adhesive ("OCA"), an optical clear resin ("OCR") or the like. When the display device 1 includes the anti-reflection member POL, the window member 20 may be attached onto a top surface (or one surface) of the anti-reflection member POL.

The window substrate 21 may be made of a transparent material. The window substrate 21 may include or be made of, for example, glass or plastic. The window substrate 21 may define an outer surface of the window member 20. The outer surface of the window member 20 may define an outer surface of the display device 1.

A planar shape of the window substrate 21 corresponds to a planar shape of the display device 1 to which the window substrate 21 is applied. In an embodiment, for example, when the display device 1 has a substantially rectangular shape in the plan view, the window substrate 21 also has a substantially rectangular shape. When the display device 1 has a circular shape, the window substrate 21 may also have a circular shape.

The printed layer 22 may be disposed on the window substrate 21. The printed layer 22 may be disposed on a first surface and/or a second surface of the window substrate 21 which is opposite to the first surface thereof along the third direction DR3. The printed layer 22 may be disposed on an edge portion of the window substrate 21 and may be disposed in the non-display area NDA. The printed layer 22 may be a light blocking layer or a decorative layer providing an aesthetic appeal. The printed layer 22 may also be referred to a light blocking pattern.

Figure 3:
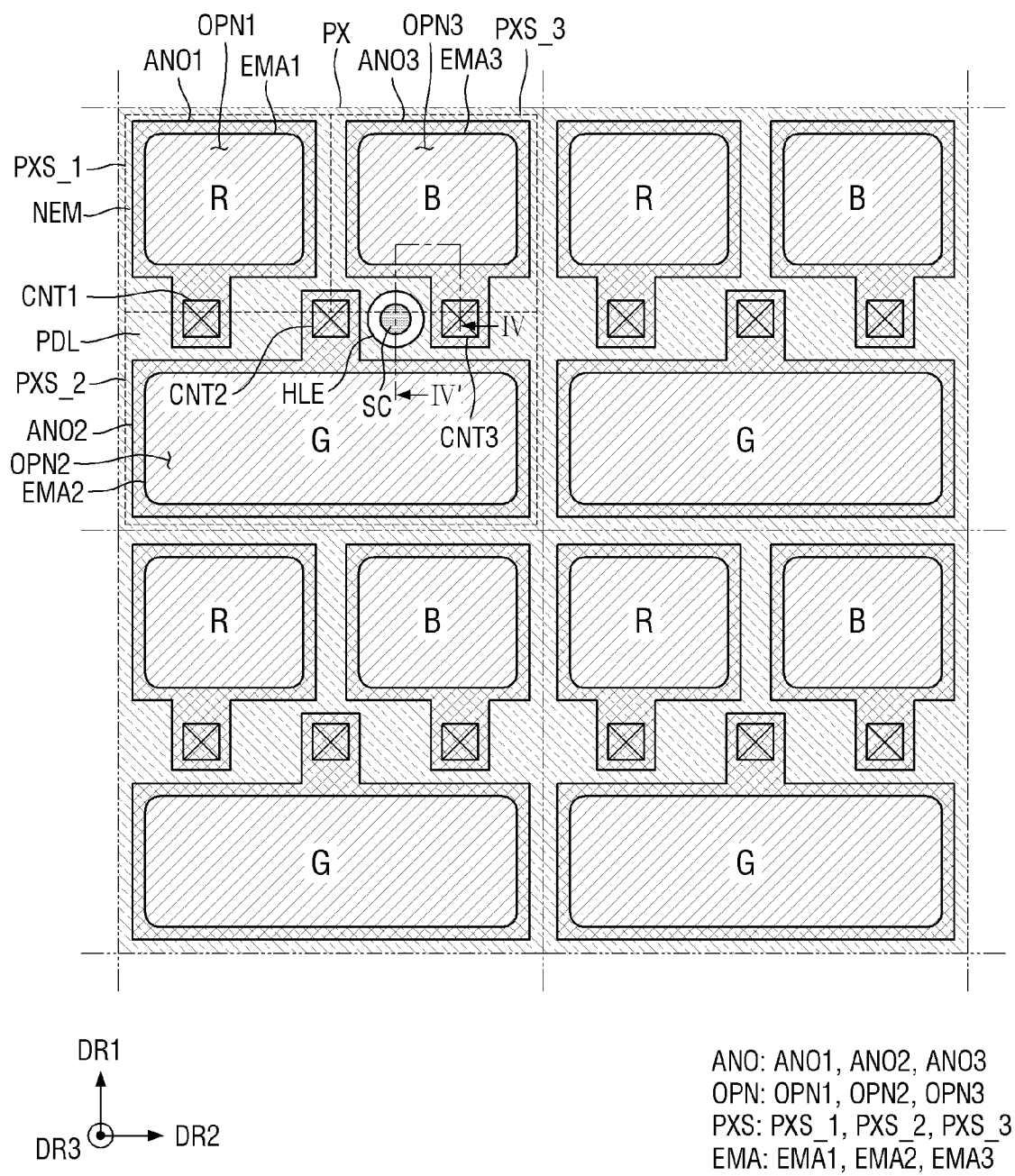
FIG. 3 is a schematic plan view showing an embodiment of a pixel arrangement of a display device.

FIG. 3 is a schematic plan view showing an embodiment of a pixel arrangement of a display device 1.

Referring to FIG. 3, the display area DA of the display device 1 includes a plurality of pixels PX. The pixel PX represents the smallest unit of repetition for display of an image. The pixel PX may include a plurality of sub-pixels PXS. The pixels PX each including the plurality of sub-pixels PXS may be alternately arranged in a matrix form.

In order to achieve full-color display, each pixel PX may include a plurality of sub-pixels PXS emitting different colors. In an embodiment, for example, each pixel PX may include a first sub-pixel PXS_1 responsible for red (R) light emission, a second sub-pixel PXS_2 responsible for green (G) light emission, and a third sub-pixel PXS_3 responsible for blue (B) light emission among the plurality of sub-pixels PXS. Each pixel PX may be provided with one of the first sub-pixel PXS_1, one of the second sub-pixel PXS_2 and one of the third sub-pixel PXS_3, without being limited thereto.

Each of the sub-pixels PXS may include an emission area EMA and a non-emission area NEM which is adjacent to the emission area EMA. The emission area EMA may be provided in plural including emission areas EMA. In an embodiment, the non-emission area NEM may surround the emission areas EMA in the plan view. The sub-pixels PXS may respectively define non-emission areas NEM. The non-emission area NEM of one of the sub-pixels PXS is in contact with the non-emission area NEM of an adjacent one of the sub-pixels PXS (regardless of whether or not the sub-pixels PXS which are adjacent to each other are in a same one of the pixels PX). The non-emission areas NEM of the sub-pixels PXS which are adjacent to each other may be integrally connected to each other. Further, the non-emission areas NEM of all the sub-pixels PXS may be integrally connected to each other, but the invention is not limited thereto. The emission areas EMA of the sub-pixels PXS which are adjacent to each other may be distinguished by the non-emission area NEM. The emission area EMA and the non-emission area NEM will be described in detail later.

Conceptually, the sub-pixels PXS which are adjacent to each other may be interpreted as being in contact with each other, to define a boundary therebetween. The boundary between the sub-pixels PXS may be located within the non-emission areas NEM that are integrally connected to each other, and thus may not be physically or visually distinguishable from each other. The boundary between the sub-pixels PXS may be located at an intermediate point of the non-emission area NEM along a width direction thereof, within a space defined between the emission areas EMA of the adjacent ones of the sub-pixels PXS. The overall planar shape of the sub-pixels PXS may be similar to that of the emission area EMA of the corresponding one of the sub-pixels PXS, but the invention is not limited thereto.

The emission areas EMA may include a first emission area EMA1, a second emission area EMA2 and a third emission area EMA3. The emission areas EMA of the sub-pixels PXS in each one of the pixels PX may not have the same shape. In an embodiment, for example, the planar shape of the first emission area EMA1 of the first sub-pixel PXS_1 may be substantially the same as the shape of the third emission area EMA3 of the third sub-pixel PXS_3, but may be different from the planar shape of the second emission area EMA2 of the second sub-pixel PXS_2, although not limited thereto. Further, a planar size of the first emission area EMA1 and the planar size of the third emission area EMA3 may smaller than a planar size of the second emission area EMA2.

In an embodiment, for example, the second emission area EMA2 may have a major dimension (e.g., length) extended along the second direction DR2 in a pixel PX, so that the length of the second emission area EMA2 along the second direction DR2 may be greater than a dimension along the first direction DR1, although not limited thereto. The first emission area EMA1 and the third emission area EMA3 may be located on a same side of the second emission area EMA2 along the first direction DR1. The first emission area EMA1 and the third emission area EMA3 may be located adjacent to each other along the second direction DR2.

An anode electrode ANO including anode electrode patterns, a pixel defining layer PDL and a spacer SC (e.g., first spacer) may be disposed on a surface of the first substrate 101. The anode electrode patterns may be in contact with a thin film transistor disposed therebelow through respective contact holes, respectively.

The pixel defining layer PDL may be disposed along the boundary of the sub-pixels PXS. The pixel defining layer PDL may be disposed on at least one of the anode electrode ANO and a via layer VIA (in FIG. 4). The pixel defining layer PDL may include a first exposed region (hereinafter, referred to as opening OPN) exposing the anode electrode ANO to outside the pixel defining layer PDL, and a second exposed region (hereinafter, referred to as through hole HLE exposing the via layer VIA to outside the pixel defining layer PDL. Hereinafter, the through hole HLE) exposing the via layer VIA will be described as a hole penetrating the pixel defining layer PDL along the thickness direction (e.g., third direction DR3), but the invention is not limited thereto.

The pixel defining layer PDL may include the opening OPN exposing the anode electrode ANO. The non-emission area NEM and the emission area EMA may be distinguished by the pixel defining layer PDL and the opening OPN. The pixel defining layer PDL may further include, in addition to the opening OPN exposing the anode electrode ANO, the through hole HLE (e.g., first through hole) penetrating the pixel defining layer PDL along the thickness direction and exposing the via layer VIA (in FIG. 4). The through hole HLE may have a circular shape in the plan view, but is not limited thereto. The through hole HLE may have a polygonal shape such as a square shape, a rectangular shape or the like in the plan view.

The spacer SC may be disposed in the through hole HLE. The spacer SC and the pixel defining layer PDL may include a top surface which is furthest from the first substrate 101. The spacer SC may include a distal end at the top surface thereof and a side surface extending from the top surface. The pixel defining layer PDL may include a side surface extending from the top surface thereof. From a reference (e.g., the first substrate 101), a height of a top surface of the spacer SC may be greater than a height of a top surface of the pixel defining layer PDL. The planar shape of the spacer SC may correspond to that of the through hole HLE. However, the invention is not limited thereto, and the planar shape of the spacer SC may be different from that of the through hole HLE.

The spacer SC may be disposed in at least one among the a plurality of pixels PX and may be disposed in a planar area of one of the pixels PX. However, without being limited thereto, the spacer SC may be disposed at a boundary between pixels PX which are adjacent to each other. While FIG. 3 shows a spacer SC relative to four of the pixels PX, the invention is not limited thereto. In an embodiment, the spacer SC may be disposed in more than one of the pixels PX among those adjacent to each other to define a plurality of spacers SC.

The pixel defining layer PDL may not overlap the spacer SC. That is, the spacer SC may be spaced apart from portions of the pixel defining layer PDL along the first substrate 101. Accordingly, even if the pixel defining layer PDL is provided or formed after the spacer SC is provided or formed, a planar area at which the spacer SC supports the second substrate 102 (in FIG. 2) disposed thereon (e.g., an effective area ratio) increases, so that the number of the spacers SC along the display area DA can be reduced. In addition, the uniformity of the upper portion of the spacer SC is improved, so that variation in a gap between the first substrate 101 and the second substrate 102 along the third direction DR3 can be reduced. Therefore, suppression of foreign substance defects due to the spacer SC and/or defects due to the variation in the gap may be reduced or effectively prevented, and a yield and reliability of the display device 1 may be improved.

Solid portions of the pixel defining layer PDL which define the opening OPN and the through hole HLE, may be spaced apart from the spacer SC. When the spacer SC is disposed in the through hole HLE, the spacer SC and the pixel defining layer PDL may be spaced apart from each other, and the pixel defining layer PDL may surround the spacer SC in the plan view, although not limited thereto. The pixel defining layer PDL may be spaced apart from the spacer SC and may expose a side surface of the spacer SC to outside the pixel defining layer PDL without completely surrounding the spacer SC in the plan view.

The pixel defining layer PDL and the spacer SC will be described in detail with reference to FIGS. 4 and 5.

Figure 4:
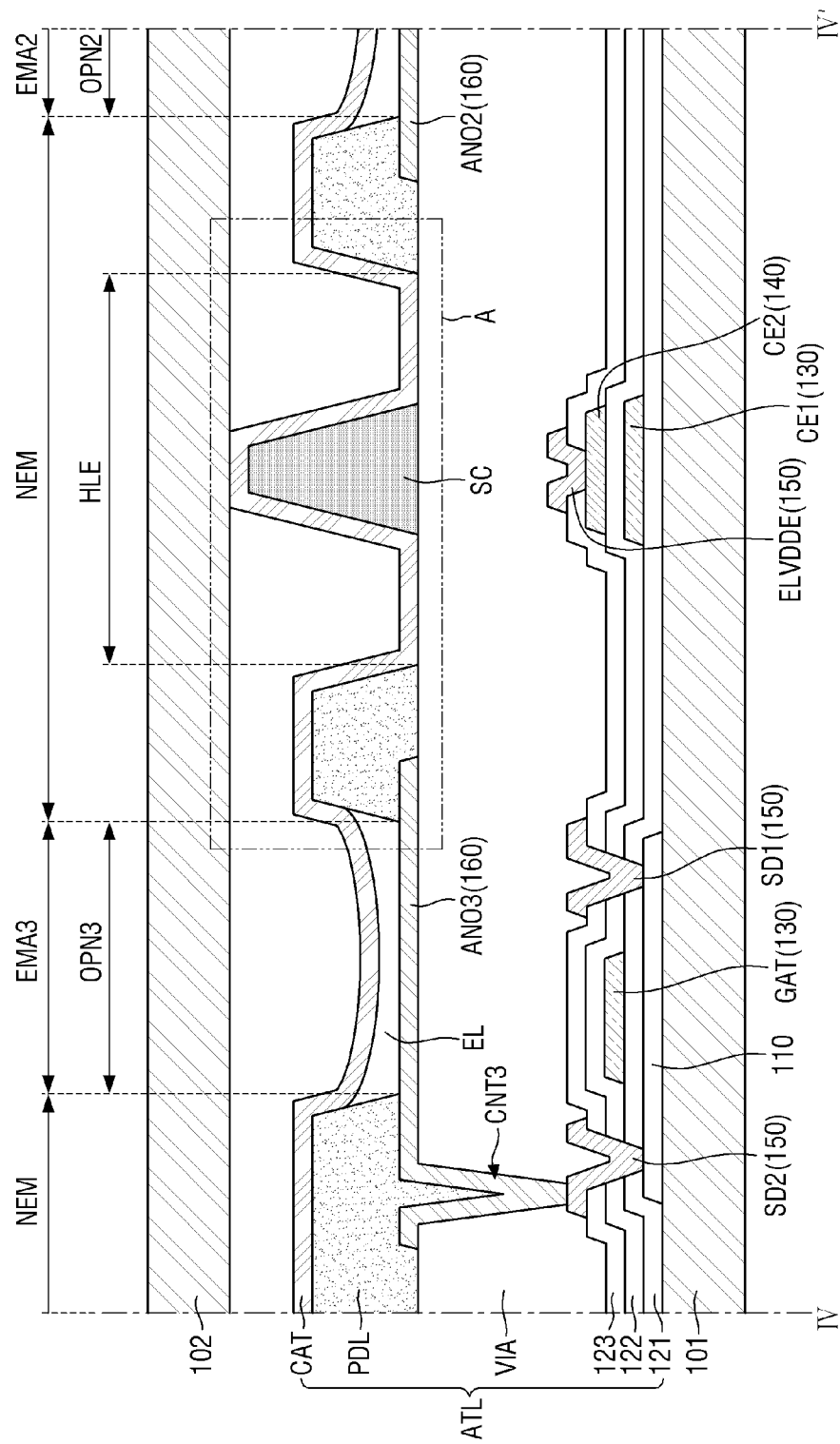
FIG. 4 is an enlarged cross-sectional view taken along line IV-IV' of FIG. 3.

FIG. 4 is a cross-sectional view taken along line IV-IV' of FIG. 3. FIG. 5 is an enlarged view of area A of FIG. 4.

Figure 5:
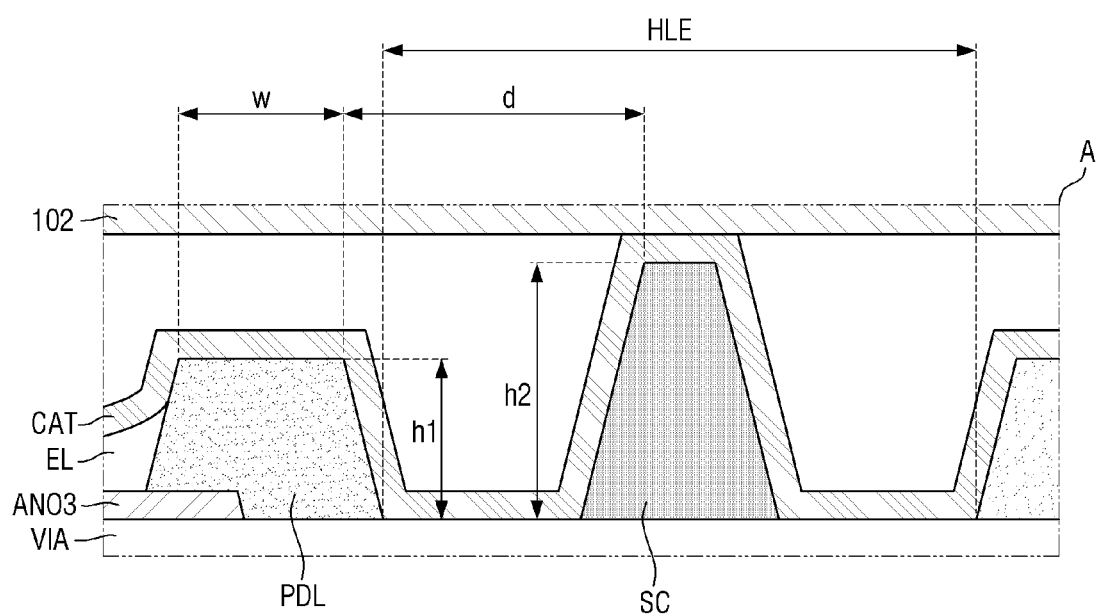
FIG. 5 is an enlarged view of area A of FIG. 4.

Referring to FIGS. 4 and 5, the active element layer ATL may cover most regions of the first substrate 101 except a partial region of the first substrate 101. The active element layer ATL may include a semiconductor layer 110, a first insulating layer 121, a first gate conductive layer 130, a second insulating layer 122, a second gate conductive layer 140, a third insulating layer 123, a data conductive layer 150, a via layer VIA, an anode electrode ANO in a conductive first electrode layer 160 which is exposed by an opening OPN of the pixel defining layer PDL, a light emitting layer EL disposed in the opening OPN of the pixel defining layer PDL, a spacer SC disposed in the through hole HLE of the pixel defining layer PDL, and a cathode electrode CAT disposed corresponding to each of the light emitting layer EL, the spacer SC and the pixel defining layer PDL. The layers described above may be sequentially stacked in order. In addition, each of the layers described above may include of a single layer or a stack of multiple layers. Other layers may be further disposed between the multiple layers.

The semiconductor layer 110 is disposed on the first substrate 101. The semiconductor layer 110 forms a channel of a thin film transistor of each of the sub-pixels PXS. The semiconductor layer 110 may include polycrystalline silicon. However, the invention is not limited thereto, and the semiconductor layer 110 may include monocrystalline silicon, low-temperature polycrystalline silicon, amorphous silicon, or an oxide semiconductor. The oxide semiconductor may include, for example, a binary compound (ABx), a ternary compound (ABxCy), or a quaternary compound (ABxCyDz) including indium, zinc, gallium, tin, titanium, aluminum, hafnium (Hf), zirconium (Zr), magnesium (Mg) and the like.

The first insulating layer 121 is disposed on the semiconductor layer 110. The first insulating layer 121 may be a gate insulating layer having a gate insulating function. The first insulating layer 121 may include a silicon compound, a metal oxide or the like. In an embodiment, for example, the first insulating layer 121 may include silicon oxide, silicon nitride, silicon oxynitride, aluminum oxide, tantalum oxide, hafnium oxide, zirconium oxide, titanium oxide or the like.

The first gate conductive layer 130 is disposed on the first insulating layer 121. The first gate conductive layer 130 may include a gate electrode GAT of the thin film transistor of each of the sub-pixels PXS and a scan line connected thereto, and a first electrode CE1 of a storage capacitor. The gate electrode GAT, the scan line and the first electrode CE1 may be in a same layer as each other. As being in a same layer, elements may be respective patterns or respective portions of a same material layer, without being limited thereto.

The first gate conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu).

The second insulating layer 122 may be disposed on the first gate conductive layer 130. The second insulating layer 122 may be an interlayer insulating layer or a second gate insulating layer. The second insulating layer 122 may include an inorganic insulating material such as silicon oxide, silicon nitride, silicon oxynitride, hafnium oxide, aluminum oxide, titanium oxide, tantalum oxide, zinc oxide and the like.

The second gate conductive layer 140 is disposed on the second insulating layer 122. The second gate conductive layer 140 may include a second electrode CE2 of the storage capacitor. The second gate conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second gate conductive layer 140 may include or be made of the same material as the first gate conductive layer 130, but is not limited thereto.

The third insulating layer 123 is disposed on the second gate conductive layer 140. The third insulating layer 123 may be an interlayer insulating layer. The third insulating layer 123 may include an inorganic insulating material such as silicon oxide, silicon nitride, silicon oxynitride, hafnium oxide, aluminum oxide, titanium oxide, tantalum oxide, zinc oxide and the like.

The data conductive layer 150 is disposed on the third insulating layer 123. The data conductive layer 150 may include a first terminal electrode SD1 and a second terminal electrode SD2 of the thin film transistor of each of the sub-pixels PXS. The first terminal electrode SD1 and the second terminal electrode SD2 of the thin film transistor may be electrically connected to a source region and a drain region of the semiconductor layer 110 via respective contact holes penetrating the third insulating layer 123, the second insulating layer 122 and the first insulating layer 121. The data conductive layer 150 may further include a first source voltage electrode ELVDDE of each of the sub-pixels PXS. The first terminal electrode SD1, the second terminal electrode SD2 and the first source voltage electrode ELVDDE may be in a same layer as each other. The first source voltage electrode ELVDDE may be electrically connected to the second electrode CE2 of the storage capacitor through a respective contact hole penetrating the third insulating layer 123.

The data conductive layer 150 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The data conductive layer 150 may be a single layer or a multilayer. In an embodiment, for example, the data conductive layer 150 may have a stacked structure of Ti/Al/Ti, Mo/Al/Mo, Mo/AlGe/Mo, or Ti/Cu.

The via layer VIA is disposed on the data conductive layer 150. The via layer VIA covers the data conductive layer 150. When the via layer VIA is provided or formed as an organic layer, the via layer VIA may have a substantially flat top surface although a bottom surface may define a stepped portion. The via layer VIA may include an organic insulating material selected from acrylic resin, epoxy resin, phenolic resin, polyamide resin, polyimide resin, unsaturated polyester resin, polyphenylene resin, polyphenylenesulfide resin and benzocyclobutene ("BCB").

The anode electrode ANO is disposed on the via layer VIA. The via layer VIA may be a planarization layer between the anode electrode ANO and the first substrate 101. The anode electrode ANO may include a first anode electrode pattern ANO1, a second anode electrode pattern ANO2 and a third anode electrode pattern ANO3. The first anode electrode pattern ANO1, the second anode electrode pattern ANO2 and the third anode electrode pattern ANO3 are exposed to outside the pixel defining layer PDL by a first opening OPN1, a second opening OPN2 and a third opening OPN3, respectively. Each of the anode electrode patterns may be a pixel electrode provided for each of the sub-pixels PXS within each of the pixels PX. The anode electrode patterns may be connected to the second terminal electrode SD2 of the thin film transistor via contact holes penetrating the via layer VIA, respectively. The first anode electrode pattern ANO1, the second anode electrode pattern ANO2 and the third anode electrode pattern ANO3 may be connected to a terminal electrode of the thin film transistor at a first contact hole CNT1, a second contact hole CNT2 and a third contact hole CNT3, respectively. The anode electrode ANO may at least partially overlap the emission area EMA of the pixel PX.

The anode electrode ANO may have a stacked structure provided or formed by stacking a material layer having a high work function, such as indium tin oxide ("ITO"), indium zinc oxide ("IZO"), zinc oxide ("ZnO") and indium oxide ($In_2O_3$), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), or a combination thereof, but is not limited thereto. The layer having a high work function may be disposed above the reflective material layer and disposed closer to the light emitting layer EL. The anode electrode ANO may have a multilayer structure such as ITO/Mg, ITO/MgF, ITO/Ag and ITO/Ag/ITO, but is not limited thereto.

The pixel defining layer PDL may be disposed on the anode electrode ANO. The pixel defining layer PDL may include or be formed of an organic insulating material or an inorganic insulating material. In an embodiment, for example, the pixel defining layer PDL may include at least one of polyimide resin, acrylic resin, a silicon compound and polyacrylic resin. The pixel defining layer PDL may further include a negative photosensitive material (negative sensitizer).

The pixel defining layer PDL may have liquid repellency. The pixel defining layer PDL may include a material having liquid repellency (or a liquid repellent material), although not limited thereto. The pixel defining layer PDL may including a compound having liquid repellency, e.g., a fluorine-based compound, a siloxane-based compound, or the like, but is not limited thereto.

In this specification, the liquid repellency means a property that repels a predetermined solution and suppresses permeation of the solution. In contrast, a lyophilic property means a property that shows affinity for a predetermined solution.

In an embodiment, the predetermined solution has a low surface bonding force with a surface having liquid repellency, and the predetermined solution disposed on the surface having the liquid repellency may have increased surface tension. The predetermined solution may have an excellent surface bonding force with a surface having a lyophilic property, and the predetermined solution disposed on the surface having the lyophilic property may have reduced surface tension.

When a surface on which the predetermined solution is disposed has liquid repellency, the predetermined solution may have a larger contact angle than that of the predetermined solution having a lyophilic property. The contact angle may indicate an angle formed by a tangent of a surface of the predetermined solution and the surface on which the predetermined solution is disposed at a point where the surface and the predetermined solution are in contact with each other. The contact angle may be increased as the liquid repellency is increased or the surface tension is increased. In an embodiment, for example, when water is disposed on a surface having liquid repellency, the contact angle of water on the surface may be within a range of more than about 90 degrees and less than about 180 degrees, although not limited thereto. Further, when water is disposed on a surface having a lyophilic property, the contact angle of water on the surface may be within a range of more than 0 degrees and less than about 90 degrees.

The liquid repellent material may be disposed on a top surface and side surfaces of the pixel defining layer PDL to define a liquid-repellent top surface and a liquid-repellent side surface. In other words, the liquid repellent material may cover the outer surface of the pixel defining layer PDL. Since the pixel defining layer PDL has liquid repellency, the light emitting layer EL may be more stably provided or formed at a desired position along the first substrate 101 during a process of providing or forming the light emitting layer EL in a display device manufacturing process, which provides improved reliability of the display device 1 (in FIG. 1).

The spacer SC may be surrounded by the pixel defining layer PDL while being spaced apart from the pixel defining layer PDL. The spacer SC may be disposed inside the through hole HLE which exposes a top surface of the via layer VIA to outside the pixel defining layer PDL. The spacer SC may be spaced apart from the pixel defining layer PDL by a separation distance d. In an embodiment, for example, the separation distance d may be greater than about 2.5 micrometers (μm) or about 5 μm, or may be within a range of about 2.5 μm to about 20 μm or within a range of about 5 μm to about 10 μm, although not limited thereto. The separation distance d may be a maximum distance between the two elements, without being limited thereto. In an embodiment, when the through hole HLE is formed in a circular shape in the plan view, a dimension (e.g., diameter) of the through hole HLE in the plan view may be greater than about 5 μm or about 10 μm, or may be within a range of about 5 μm to about 40 μm or within a range of about 10 μm to about 20 μm.

A minimum distance w of the pixel defining layer PDL which is defined between the opening OPN exposing the anode electrode ANO and the through hole HLE exposing the via layer VIA may be greater than about 8 μm. The minimum distance w may be a dimension of a top surface at a distal end of the pixel defining layer PDL, without being limited thereto.

The spacer SC may not overlap the pixel defining layer PDL along the thickness direction. In other words, the pixel defining layer PDL may be spaced apart from at least a top surface of the spacer SC. The pixel defining layer PDL may not be disposed corresponding to the side surfaces of the spacer SC as well as the top surface of the spacer SC.

The spacer SC may be disposed in the same layer as the pixel defining layer PDL. As being in the same layer, the spacer SC and the pixel defining layer PDL may each form an interface with a same layer, e.g., the via layer VIA. In an embodiment, for example, although not limited to the following, a part of the pixel defining layer PDL extends along a side surface and a top surface of the anode electrode ANO. However, most of the pixel defining layer PDL may be disposed extended along an exposed portion of the via layer VIA while being in direct contact with the via layer VIA. Similarly, the spacer SC may be disposed on the via layer VIA while being in direct contact with the via layer VIA. In other words, the spacer SC may be disposed on the via layer VIA together with the pixel defining layer PDL, while both are in direct contact with the via layer VIA to form respective interfaces therebetween.

The spacer SC may serve to maintain a gap with a structure disposed thereon. In an embodiment of providing the display device 1, for example, in depositing of an organic material of the light emitting layer EL through a fine metal mask ("FMM"), the spacer SC may serve to reduce or effectively prevent the fine metal mask from slipping down toward the first substrate 101. In an embodiment, the spacer SC may serve to support a structure laminated thereon, to maintain a cell gap between the first substrate 101 and the second substrate 102, and to mitigate deformation of the display panel 10 caused by stress when the display panel 10 is pressed.

The spacer SC may form a stepped portion with respect to layers or elements adjacent thereto or where the spacer SC is not disposed (e.g., omitted). The height of the top surface of the spacer SC may be greater than that of the top surface of the pixel defining layer PDL, with respect to a reference such as the via layer VIA. In an embodiment, a second thickness h2 (or a height) of the spacer SC may be greater than a first thickness h1 (or a height) of a portion of the pixel defining layer PDL which is adjacent to the spacer SC. The first thickness h1 of the pixel defining layer PDL may be within a range of about 1.0 µm to about 1.5 µm or within a range of about 0.5 µm to about 1.5 µm, and the second thickness h2 of the spacer SC may be within a range of about 1.6 µm to about 2.5 µm or within a range of about 1.6 µm to about 3.5 µm, although not limited thereto.

Similarly to the pixel defining layer PDL, the spacer SC may include an organic insulating material. In an embodiment, for example, the spacer SC may include at least one of polyimide resin, acrylic resin, a silicon compound, polyacrylic resin, epoxy resin and the like.

The spacer SC may include an organic insulating material different from that of the pixel defining layer PDL. In other words, the spacer SC may not include an organic insulating material included in the pixel defining layer PDL, and may include an organic insulating material different from the organic insulating material included in the pixel defining layer PDL. In an embodiment, for example, the pixel defining layer PDL may include polyimide resin, although not limited thereto. Where the pixel defining layer PDL includes polyimide resin, the spacer SC may include acrylic resin or epoxy resin. However, without being limited thereto, the spacer SC may include the same organic insulating material as that of the pixel defining layer PDL.

The spacer SC may further include a sensitizer different from that of the pixel defining layer PDL. In an embodiment, for example, the spacer SC may include a positive photosensitive material (positive sensitizer). However, without being limited thereto, the spacer SC may include a negative photosensitive material (sensitizer), similarly to the pixel defining layer PDL. The spacer SC and the pixel defining layer PDL may be respective portions of different material layers provided or formed by different processes, but both forming an interface with a same underlying layer. That is, a layer of the display panel 10 includes both the spacer SC and the pixel defining layer PDL. This will be described later.

The spacer SC may have liquid repellency different from that of the pixel defining layer PDL. In other words, the spacer SC may have a lyophilic property or may have liquid repellency weaker than that of the pixel defining layer PDL. Therefore, the spacer SC may have a contact angle different from that of the pixel defining layer PDL. In an embodiment, for example, a first contact angle between water disposed on a surface of the pixel defining layer PDL and a surface of the pixel defining layer PDL may be greater than a second contact angle between water disposed on the surface of the spacer SC and the surface of the spacer SC.

Liquid repellency of the pixel defining layer PDL may be maintained by providing or forming the pixel defining layer PDL after the spacer SC is provided or formed. Further, since the spacer SC is spaced apart from the pixel defining layer PDL without overlapping the pixel defining layer PDL along the thickness direction, height uniformity of the region where the spacer SC is disposed even when the pixel defining layer PDL is provided or formed after the spacer SC is provided or formed may be maintained or improved. In other words, by removing portions of material of the pixel defining layer PDL disposed on the spacer SC during a process of providing the display panel 10, uniformity of the top surface of the spacer SC and uniformity of the cathode electrode CAT disposed on the top surface of the spacer SC may be improved, and defects due to the variation in the gap between the first substrate 101 and the second substrate 102 may be suppressed or prevented.

Further, by removing portions of material of the pixel defining layer PDL disposed on the spacer SC during a process of providing the display panel 10, an effective area ratio of the spacer SC capable of supporting a component (e.g., the second substrate 102) disposed thereon may be increased and to reduce the number of the spacers SC within the display panel 10. Therefore, defects due to foreign substances that may occur in the process of provided or forming the spacer SC may be suppressed or prevented. As a result, the yield and the reliability of the display device 1 (in FIG. 1) can be improved.

The light emitting layer EL is disposed on the anode electrode ANO exposed by the pixel defining layer PDL to outside thereof. The light emitting layer EL may include an organic material layer. The organic material layer of the light emitting layer EL may include an organic light emitting layer, and may further include a hole injecting/transporting layer and/or an electron injecting/transporting layer. The light emitting layer EL may be provided or formed by inkjet printing and, thus, the top surface of the light emitting layer EL may have a downwardly concave shape in a cross-sectional view, although not limited thereto. In other words, a thickness of the light emitting layer EL may increase in a direction toward the pixel defining layer PDL. In other words, the thickness of the light emitting layer EL may increase from a central portion of the light emitting layer EL toward an outer side thereof in the plan view.

The cathode electrode CAT may be disposed on the light emitting layer EL. The cathode electrode CAT may be a common electrode extended across all the pixels PX. The cathode electrode CAT may be provided or formed to be conformal to a structure disposed therebelow to reflect a stepped portion of the structure disposed therebelow. The anode electrode ANO, the light emitting layer EL and the cathode electrode CAT may together constitute an organic light emitting element.

The cathode electrode CAT may cover the light emitting layer EL and may extend from the light emitting layer EL to be disposed on the pixel defining layer PDL. The cathode electrode CAT may be in contact with not only the top surface of the light emitting layer EL and the top surface of the pixel defining layer PDL but also the side surfaces of the pixel defining layer PDL. Further, the cathode electrode CAT may be in contact with the outer surface of the spacer SC, and may cover the surface of the spacer SC. The cathode electrode CAT may cover the top surface and the side surfaces of the spacer SC.

Further, the cathode electrode CAT may cover a part of the exposed top surface of the via layer VIA while being in direct contact with the via layer VIA. In other words, a portion of the cathode electrode CAT may be disposed inside the through hole HLE which exposes a top surface of the via layer VIA to outside the pixel defining layer PDL, and may cover the via layer VIA in a region of the through hole HLE where the spacer SC is omitted while being in direct contact with the via layer VIA in that region. In other words, the through hole HLE exposes a portion of the via layer VIA to outside the pixel defining layer PDL, and the cathode electrode CAT may be in direct contact with the exposed portion of the via layer VIA at the through hole HLE.

The cathode electrode CAT may include a material layer having a low work function, such as Li, Ca, LiF/Ca, LiF/Al, Al, Mg, Ag, Pt, Pd, Ni, Au Nd, Ir, Cr, BaF, Ba or a combination thereof (e.g., Ag and Mg). The cathode electrode CAT may further include a transparent metal oxide layer disposed on the material layer having a low work function.

A second substrate 102 is disposed on the cathode electrode CAT. The cathode electrode CAT and the second substrate 102 may be in direct contact with each other, but the invention is not limited thereto.

Hereinafter, an embodiment of a method of fabricating a display device 1 will be described with reference to FIGS. 6 to 11. A detailed description of a method of providing the components of the thin film transistor disposed on the first substrate 101, the via layer VIA and the anode electrode ANO will be omitted for convenience of explanation.

FIGS. 6 to 11 are enlarged cross-sectional views illustrating an embodiment of a method of providing a display device 1.

Figure 6:
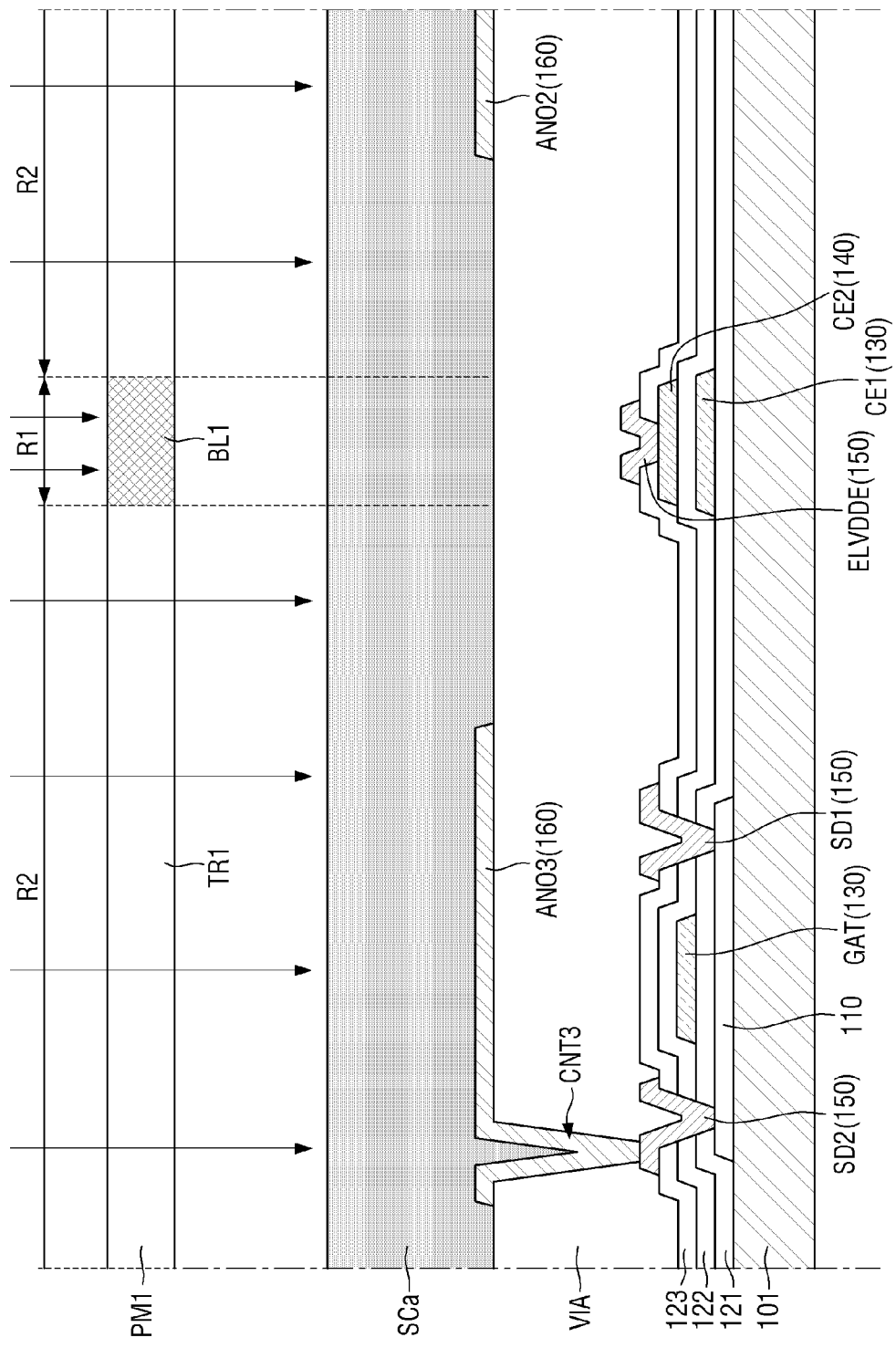
FIGS. 6 to 11 are cross-sectional views illustrating an embodiment of a method of providing a display device.
Figure 7:
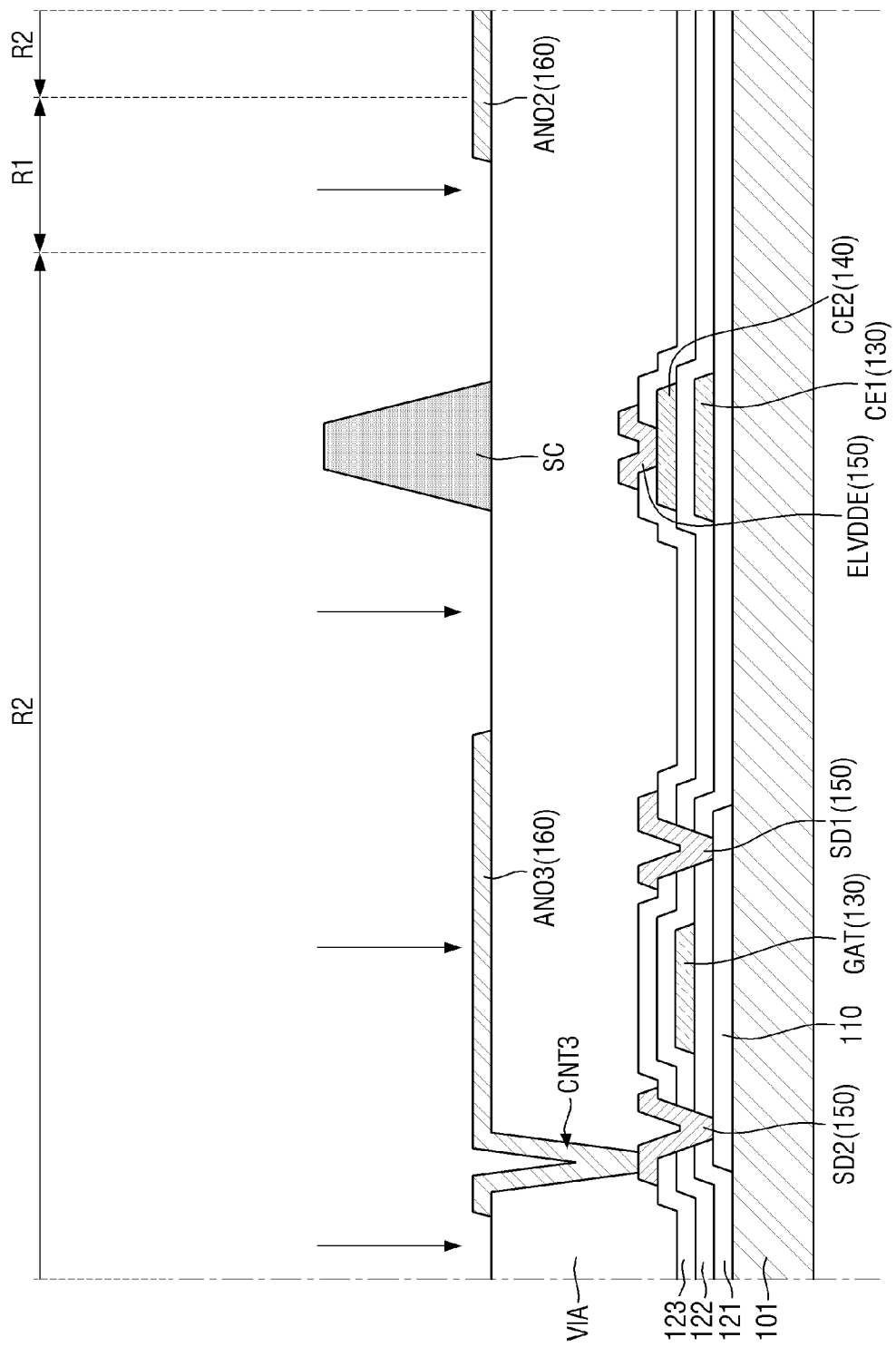

Referring to FIGS. 6 and 7, a spacer SC is provided or formed using a first photomask PM1 before providing a pixel defining layer PDL (in FIG. 4).

Specifically, the respective components of the thin film transistor are provided or formed on the first substrate 101, and the via layer VIA and the anode electrode ANO are provided or formed on the thin film transistor. A spacer material layer SCa is provided or formed on the via layer VIA having the anode electrode ANO thereon, such as being on an entirety of the via layer VIA. In other words, the spacer material layer SCa may be disposed on the entirety of the via layer VIA while covering the anode electrode ANO which is previously provided contacting the via layer VIA.

The spacer material layer SCa may include an organic material which includes a photosensitive material. The spacer material layer SCa may be patterned by performing exposure and development using the first photomask PM1 to form a spacer SC. The providing of the spacer SC may also uncover the anode electrode ANO from the spacer material layer SCa.

The first photomask PM1 disposed above the spacer material layer SCa may include a plurality of regions BL1 and TR1 having different light transmittances. In an embodiment, the first photomask PM1 may be divided into a light blocking portion BL1 and a light transmitting portion TR1 based on the light transmittance. The light transmittance of the light blocking portion BL1 may be smaller than that of the light transmitting portion TR1.

The spacer material layer SCa may be divided into a first region R1 and a second region R2. The first region R1 of the spacer material layer SCa may correspond to the light blocking portion BL1 of the first photomask PM1, and the second region R2 of the spacer material layer SCa may correspond to the light transmitting portion TR1 of the first photomask PM1. The light blocking portion BL1 of the first photomask PM1 may correspond to the spacer SC and the light transmitting portion TR1 of the first photomask PM1 may correspond to a remaining region of the via layer VIA excluding the spacer SC.

The light blocking portion BL1 may block the light provided from outside the first photomask PM1 (e.g., downward arrows in FIG. 6) to prevent the light from reaching the first region R1 of the spacer material layer SCa. The light transmitting portion TR1 may transmit most of the light provided from outside the photomask PM1 to allow most of the light to reach the second region R2 of the spacer material layer SCa. The first photomask PM1 may be removed from the exposed structure.

In an embodiment, for example, when the spacer material layer SCa includes a positive sensitizer, the unexposed portion (first region R1) is hardened and becomes insoluble in a developer. A portion of the spacer material layer SCa that is exposed to the light and a portion of the spacer material layer SCa that is not exposed to the light may be selectively removed depending on chemical change characteristics using a predetermined developing solution (e.g., downward arrows in FIG. 7). Accordingly, the spacer SC shown in FIG. 7 may be patterned from the spacer material layer SCa by selectively removing portions of the spacer material layer SCa at the second region R2 thereof. That is, the spacer SC is a patterned portion of the spacer material layer SCa, and may define a remaining portion of the spacer material layer SCa.

However, when the spacer material layer SCa includes a negative sensitizer, whether the spacer material layer SCa remains in the first region R1 or in the second region R2 may be reversed.

Although will be described later, providing or forming of the light emitting layer EL (in FIG. 4) by inkjet printing includes the pixel defining layer PDL (in FIG. 4) having liquid repellency. When the pixel defining layer PDL (in FIG. 4) has liquid repellency, providing of the light emitting layer EL (in FIG. 4) by inkjet printing on the anode electrode ANO (in FIG. 4) exposed by the pixel defining layer PDL (in FIG. 4) may be more stable. In a conventional method of performing exposure and development using a photomask after the pixel defining layer PDL (in FIG. 4) having liquid repellency is provided, the liquid repellency of the pixel defining layer PDL in FIG. 4) may not be maintained. Therefore, in one or more embodiment, by providing the spacer SC before the pixel defining layer PDL (in FIG. 4) is provided, the liquid repellency of the pixel defining layer PDL (in FIG. 4) is maintained even if the spacer SC is provided in a same layer as the pixel defining layer PDL.

Figure 8:
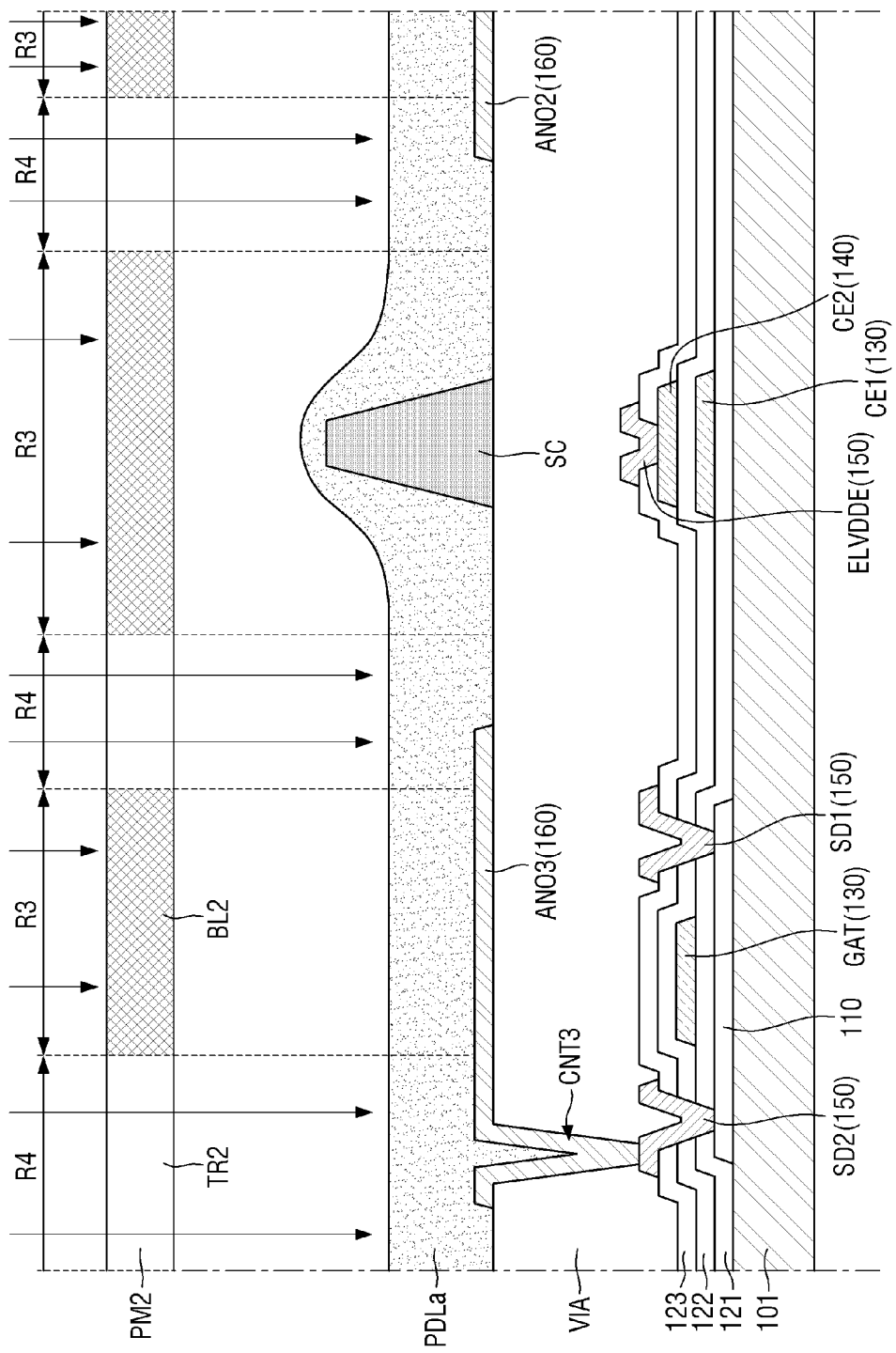
Figure 9:
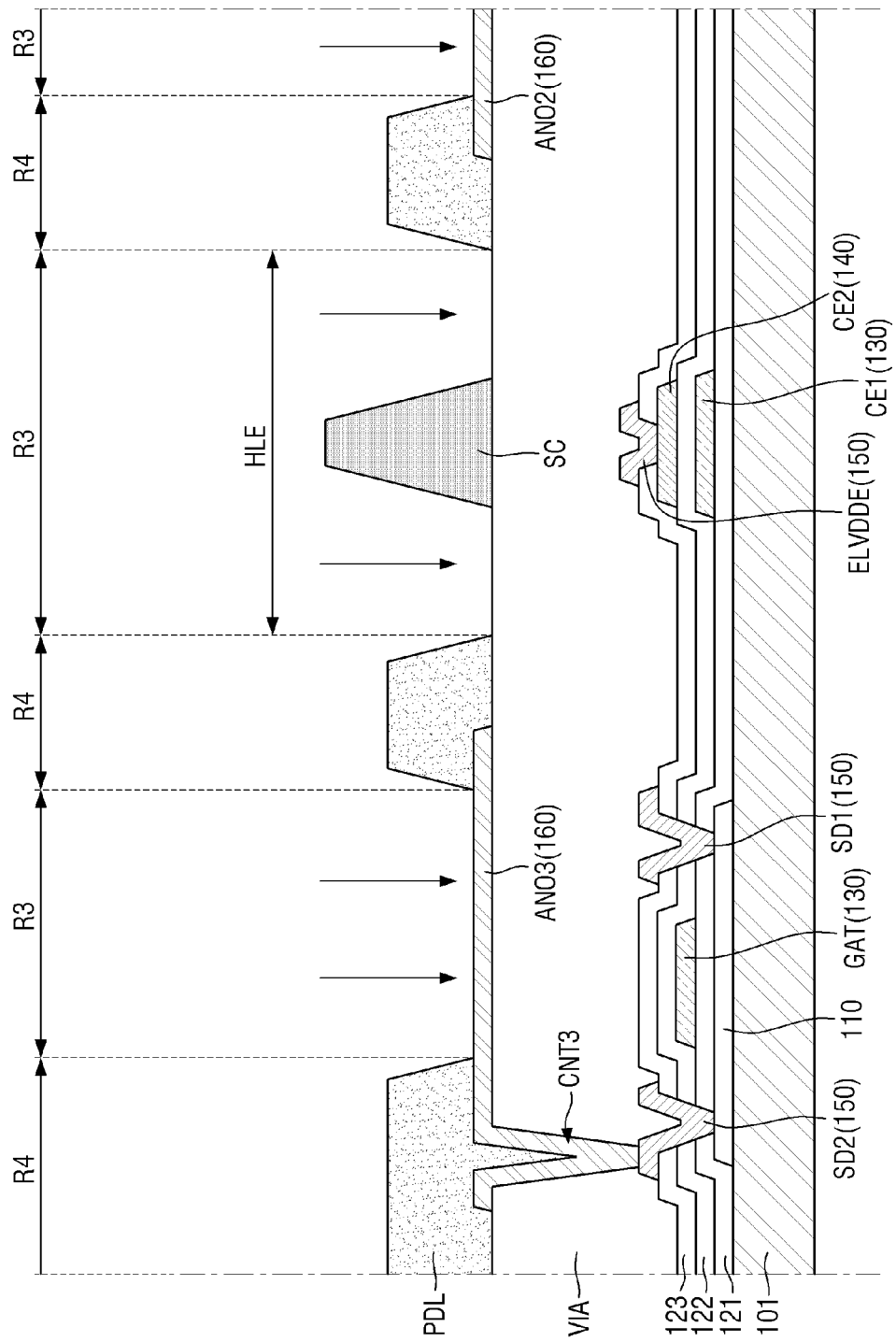

Referring to FIGS. 8 and 9, the pixel defining layer PDL is provided or formed using a second photomask PM2 different from the first photomask PM1 (in FIG. 6). The pixel defining layer PDL may include, e.g., an organic material having a photosensitive material. The pixel defining layer PDL may be provided or formed by coating a pixel defining layer material layer PDLa and performing exposure and development to pattern the pixel defining layer material layer PDLa.

Specifically, the pixel defining layer material layer PDLa may be disposed on an entirety of the via layer VIA having the anode electrode ANO and the spacer SC thereon and in contact therewith. The pixel defining layer material layer PDLa may cover the anode electrode ANO. Further, the pixel defining layer material layer PDLa may cover the spacer SC. The pixel defining layer material layer PDLa may be disposed on the top surface as well as the side surfaces of the spacer SC to cover the spacer SC.

The pixel defining layer material layer PDLa may be patterned using the second photomask PM2 disposed facing the pixel defining layer material layer PDLa. The second photomask PM2 may include a plurality of regions having different light transmittances. The second photomask PM2 may be divided into a light blocking portion BL2 and a light transmitting portion TR2 based on the light transmittance. The light transmittance of the light blocking portion BL2 may be smaller than that of the light transmitting portion TR2.

The pixel defining layer material layer PDLa may be divided into a third region R3 and a fourth region R4. The third region R3 of the pixel defining layer material layer PDLa may correspond to the light blocking portion BL2 of the second photomask PM2, and the fourth region R4 of the pixel defining layer material layer PDLa may correspond to the light transmitting portion TR2 of the second photomask PM2. The light blocking portion BL2 of the second photomask PM2 may correspond to solid portions of the pixel defining layer PDL and the light transmitting portion TR2 of the second photomask PM2 may correspond to the opening OPN and the through hole HLE.

The light blocking portion BL2 may block the light provided from outside the second photomask PM2 (e.g., downward arrows in FIG. 8) to prevent the light from reaching the third region R3 of the pixel defining layer material layer PDLa. The light transmitting portion TR2 may transmit most of the light provided from outside the second photomask PM2 to allow most of the light to reach the fourth region R4 of the pixel defining layer material layer PDLa. The second photomask PM2 may be removed from the exposed structure.

In an embodiment, for example, when the pixel defining layer material layer PDLa includes a negative sensitizer, the exposed portion (fourth region R4) is hardened and becomes insoluble in a developer. At this time, a portion of the pixel defining layer material layer PDLa that is exposed to the light and a portion of the pixel defining layer material layer PDLa that is not exposed to the light may be selectively removed depending on chemical change characteristics using a predetermined developing solution (e.g., downward arrows in FIG. 9). Accordingly, the pixel defining layer PDL, the opening OPN exposing the anode electrode ANO and the through hole HLE exposing the via layer VIA shown in FIG. 9 may be formed by selectively removing portions of the pixel defining layer material layer PDLa at the third region R3. That is, the pixel defining layer PDL is a patterned portion of the pixel defining layer material layer PDLa and may define a remaining portion of the pixel defining layer material layer PDLa.

In the process of providing or forming the through hole HLE, the spacer SC covered by the pixel defining layer material layer PDLa may be uncovered from the pixel defining layer material layer PDLa. In an embodiment, in the process of providing or forming the pixel defining layer PDL by patterning the pixel defining layer material layer PDLa, the opening OPN exposing the anode electrode ANO and the through hole HLE may be simultaneously provided or formed, and the pixel defining layer material layer PDLa around the spacer SC may be removed by providing or forming the through hole HLE. Since the pixel defining layer material layer PDLa covering the top surface and the side surfaces of the spacer SC is removed, uniformity of the upper portion of the spacer SC may be improved and defects due to the variation in the gap between the first substrate 101 and the second substrate 102 may be suppressed or prevented. Further, since the uniformity of the upper portion of the spacer SC is improved, the effective area of the spacer SC supporting a structure disposed thereon may be increased. Accordingly, the number of the spacers SC is reduced and defects due to foreign substances of the spacer SC are reduced.

In one or more embodiment, even if the pixel defining layer PDL is provided or formed after the spacer SC, by removing the pixel defining layer material layer PDLa around the spacer SC, uniformity of the upper portion of the spacer SC is improved and defects due to the variation in the gap between the first substrate 101 and the second substrate 102 and defects that may occur due to foreign substances of the spacer SC may be reduced.

Further, the liquid repellency of the pixel defining layer PDL can be maintained or improved by provided or forming the pixel defining layer PDL after the spacer SC is provided or formed and allowing the pixel defining layer material layer PDLa to include a negative sensitizer. In an embodiment, the pixel defining layer material layer PDLa may include a material having liquid repellency to be a liquid repellent material. The material having liquid repellency may be disposed on an entirety of a surface of the pixel defining layer material layer PDLa such as outside of the pixel defining layer material layer PDLa without being limited thereto. In the process of exposing and developing the pixel defining layer material layer PDLa, the material having liquid repellency in the region exposed to light may generally move toward the surface of the pixel defining layer material layer PDLa, and the liquid repellency of the surface of the pixel defining layer PDL may be increased. Therefore, the amount of the material having liquid repellency included within the pixel defining layer material layer PDLa can be reduced to thereby reduce a processing cost. Further, since the surface of the pixel defining layer material layer PDLa is more easily coated with a material having liquid repellency, so that the light emitting layer EL (in FIG. 4) can be more easily disposed at a desired position.

Figure 10:
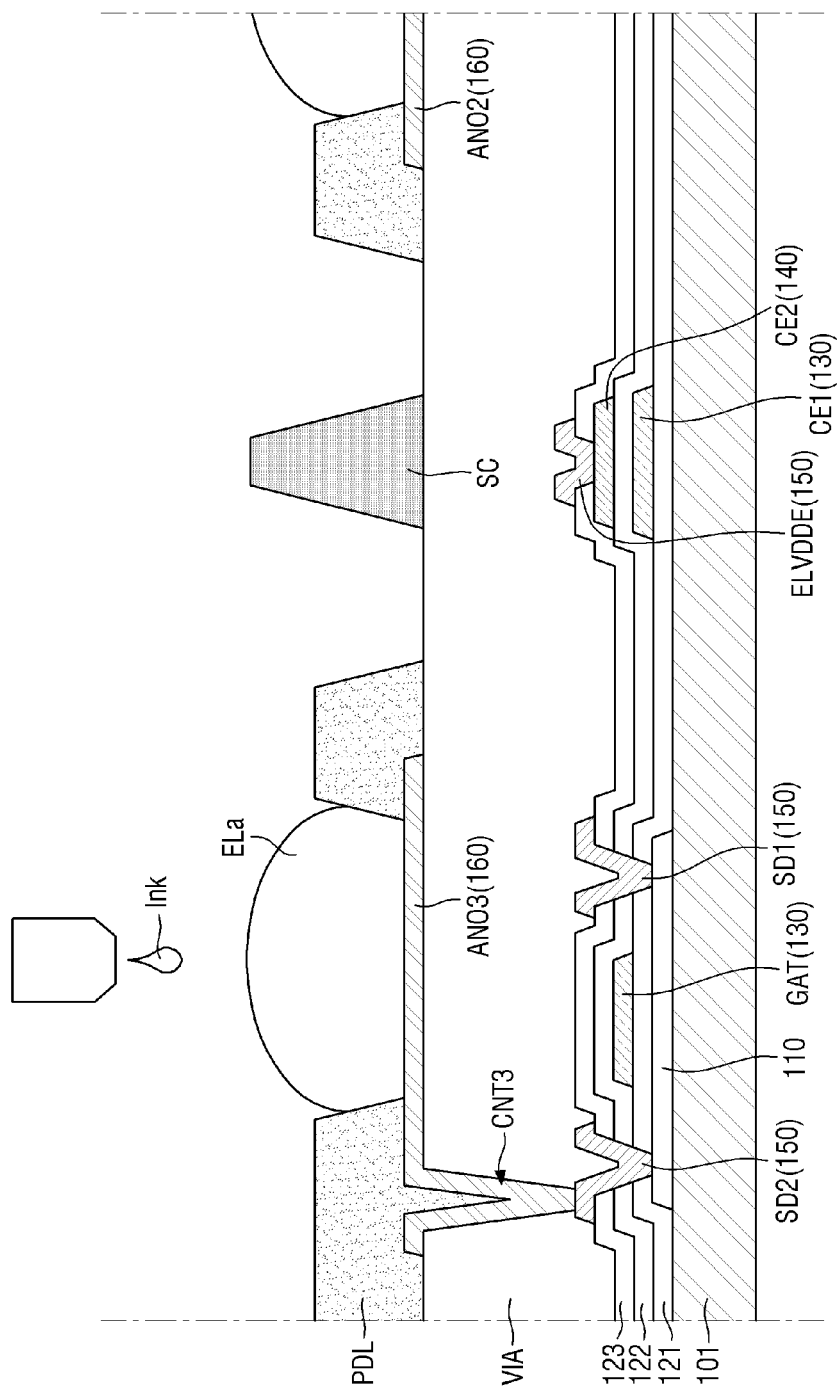
Figure 11:
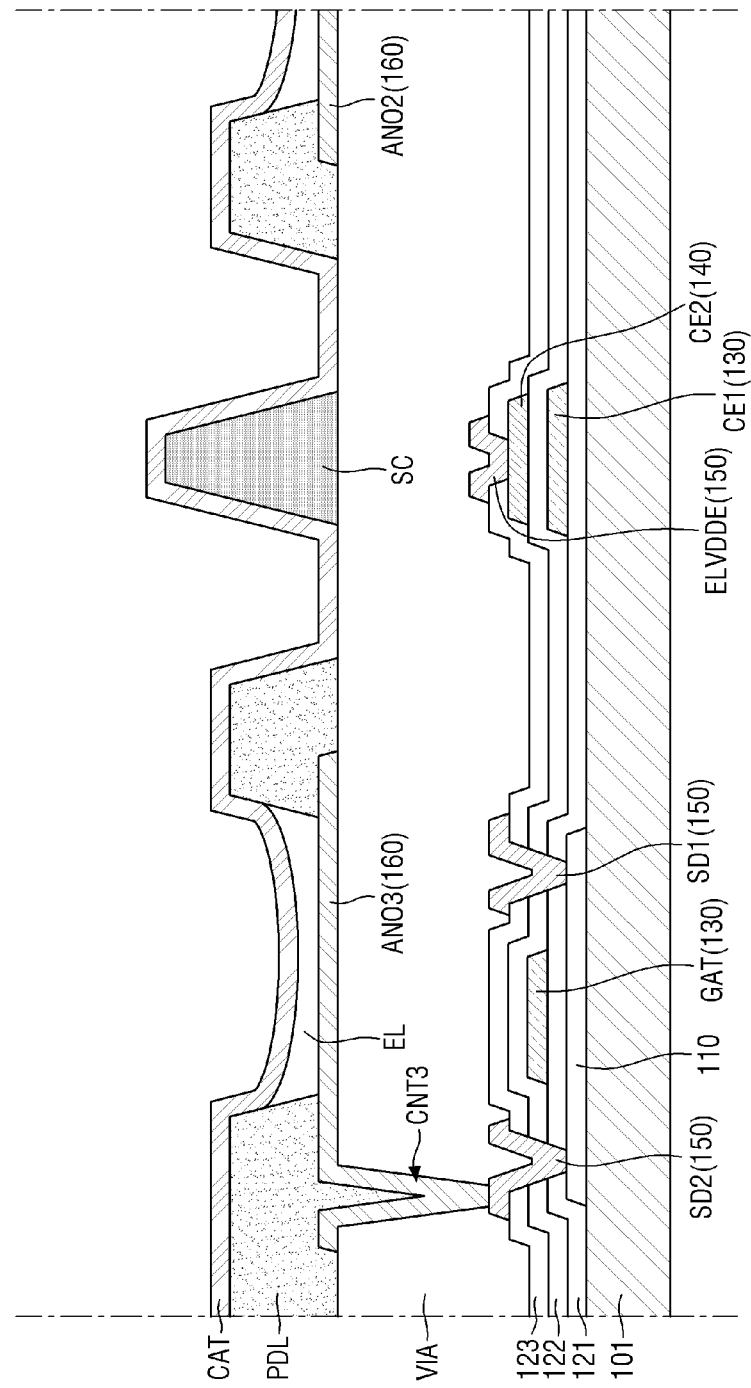

Referring to FIGS. 10 and 11, the light emitting layer EL is provided or formed at the opening OPN, such as by inkjet printing, and the cathode electrode CAT is provided or formed to cover the light emitting layer EL, the pixel defining layer PDL, the spacer SC and the via layer VIA.

Specifically, the light emitting layer material layer ELa is disposed on the anode electrode ANO exposed outside of the pixel defining layer PDL. Since the pixel defining layer PDL has liquid repellency, a surface bonding force between light emitting layer material layer Ela and the pixel defining layer PDL is low, which increases a contact angle between the light emitting layer material layer ELa and the pixel defining layer PDL. Therefore, the light emitting layer material layer Ela does not overflow onto the top surface of the pixel defining layer PDL, and can be more stably disposed on the anode electrode ANO exposed outside of the pixel defining layer PDL.

The light emitting layer material layer ELa may be provided to the anode electrode ANO by injection of ink including the light emitting layer material layer ELa by an inkjet printing device (or a liquid droplet injection device), and may be disposed on the anode electrode ANO exposed outside of the pixel defining layer PDL, although not limited thereto. Accordingly, even in a high-resolution display device, the light emitting layer EL can be provided or formed at a desired position more accurately.

After the light emitting layer material layer ELa is inkjet-printed, the light emitting layer material layer ELa is dried to provide or form a light emitting layer EL. A solvent of the light emitting layer material layer ELa may evaporate by the drying process, and a volume of the light emitting layer material layer ELa is reduced to form the light emitting layer EL shown in FIG. 11, e.g., a light emitting layer pattern. The injection amount of the light emitting layer material layer ELa may be determined in consideration of a surface tension and the amount of volume reduction after the drying.

After the light emitting layer EL is provided or formed, a cathode electrode CAT shown in FIG. 11 may be provided formed. The cathode electrode CAT may be provided or formed on an entirety of the via layer VIA while covering the anode electrode ANO, the spacer SC, the pixel defining layer PDL and the light emitting layer EL.

Although not illustrated, after the cathode electrode CAT is provided or formed, a second substrate 102 (in FIG. 4) may be disposed on the cathode electrode CAT to face the first substrate 101 with the stacked structure detailed above provided therebetween.

In the following embodiments, a description of the same components as those of the above-described embodiment will be omitted or simplified, and differences will be mainly described.

Figure 12:
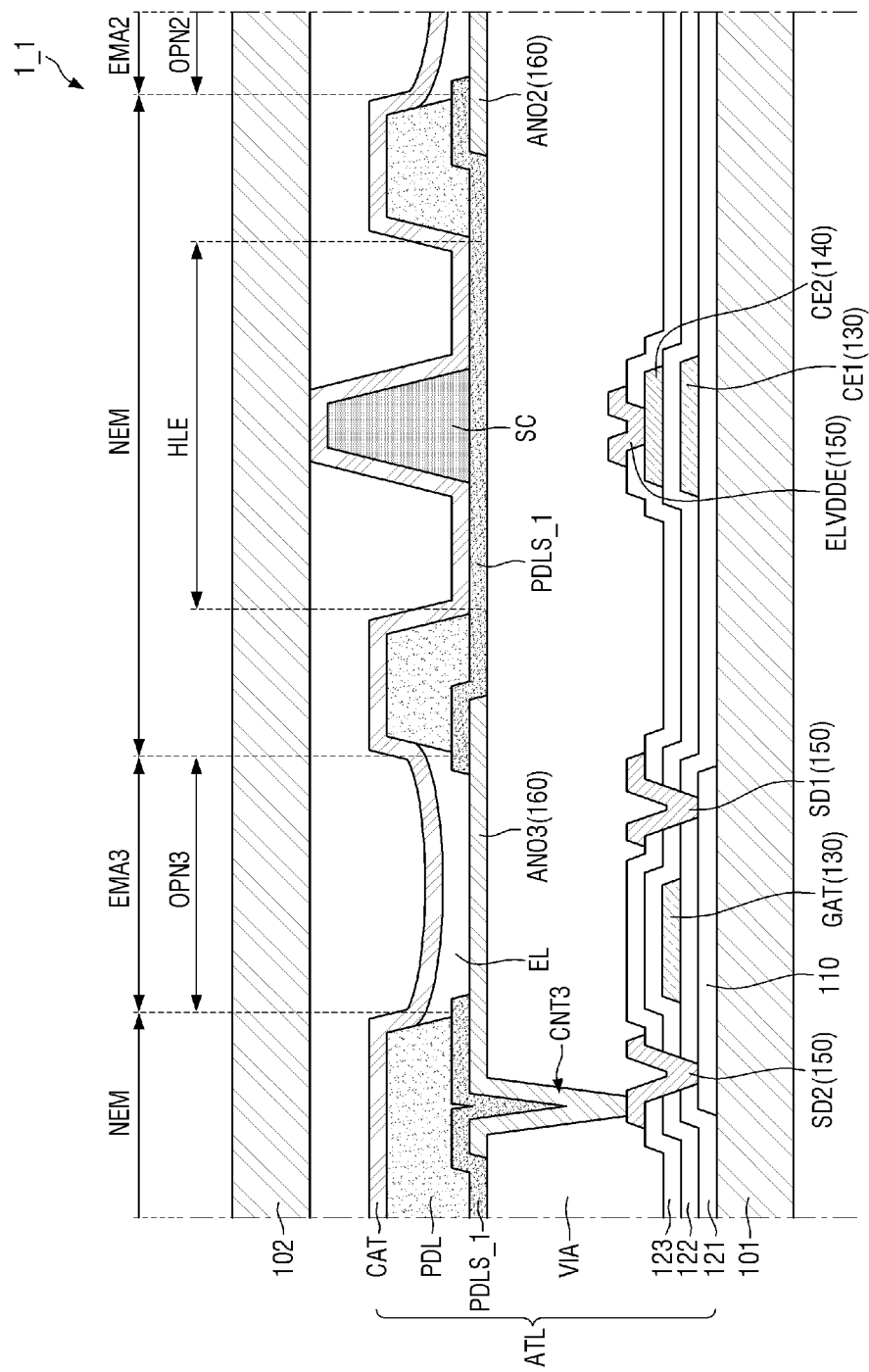
FIG. 12 is an enlarged cross-sectional view of a display device.

FIG. 12 is an enlarged cross-sectional view of a display device 1_1.

Referring to FIG. 12, a display device 1_1 is different from the embodiment of FIG. 4 in that the display device 1_1 further includes a sub-pixel defining layer PDLS_1 disposed below the pixel defining layer PDL.

Specifically, the display device 1_1 may further include the sub-pixel defining layer PDLS_1 in addition to the pixel defining layer PDL. The sub-pixel defining layer PDLS_1 may be disposed below the pixel defining layer PDL. The sub-pixel defining layer PDLS_1 may be disposed between the pixel defining layer PDL and the via layer VIA, between the pixel defining layer PDL and the anode electrode ANO, and between the spacer SC and the via layer VIA. The sub-pixel defining layer PDLS_1 may be disposed in a region corresponding to the through hole HLE in the pixel defining layer PDL. The through hole HLE in the pixel defining layer PDL may expose the sub-pixel defining layer PDLS_1 to outside the pixel defining layer PDL.

A planar shape of the sub-pixel defining layer PDLS_1 in a region except the through holes HLE in the pixel defining layer PDL may be substantially the same as that of the pixel defining layer PDL, but the invention is not limited thereto. The sub-pixel defining layer PDLS_1 may be disposed corresponding to an edge portion of the light emitting layer EL and may surround a lowermost portion of the light emitting layer EL which is closest to the via layer VIA. A side surface of the sub-pixel defining layer PDLS_1 at the opening OPN in the pixel defining layer PDL which exposes the anode electrode ANO to outside the pixel defining layer PDL may protrude further into the opening OPN than the side surface of the pixel defining layer PDL, but the invention is not limited thereto.

The sub-pixel defining layer PDLS_1 may have a lyophilic property. The sub-pixel defining layer PDLS_1 may include a material having a lyophilic property, to define a lyophilic material, although not limited thereto. In other words, the liquid repellency of the sub-pixel defining layer PDLS_1 may be weaker than that of the pixel defining layer PDL.

Since the sub-pixel defining layer PDLS_1 having a lyophilic property is disposed at the edge portion of the light emitting layer EL to surround the lowermost portion of the light emitting layer EL, uneven formation of the light emitting layer EL may be suppressed or prevented, and uniformity of the light emitting layer EL and uniformity of the light emitted from the emission areas EMA may be improved.

In the display device 1_1 including the sub-pixel defining layer PDLS_1 having a lyophilic property, the pixel defining layer PDL and the spacer SC are spaced apart from each other, so that the liquid repellency of the pixel defining layer PDL can be maintained by providing the pixel defining layer PDL after the spacer SC is provided. Further, where the pixel defining layer PDL is provided after the spacer SC is provided, uniformity of the upper portion of the spacer SC is improved and the actual effective area ratio of the spacer SC may be increased.

Figure 13:
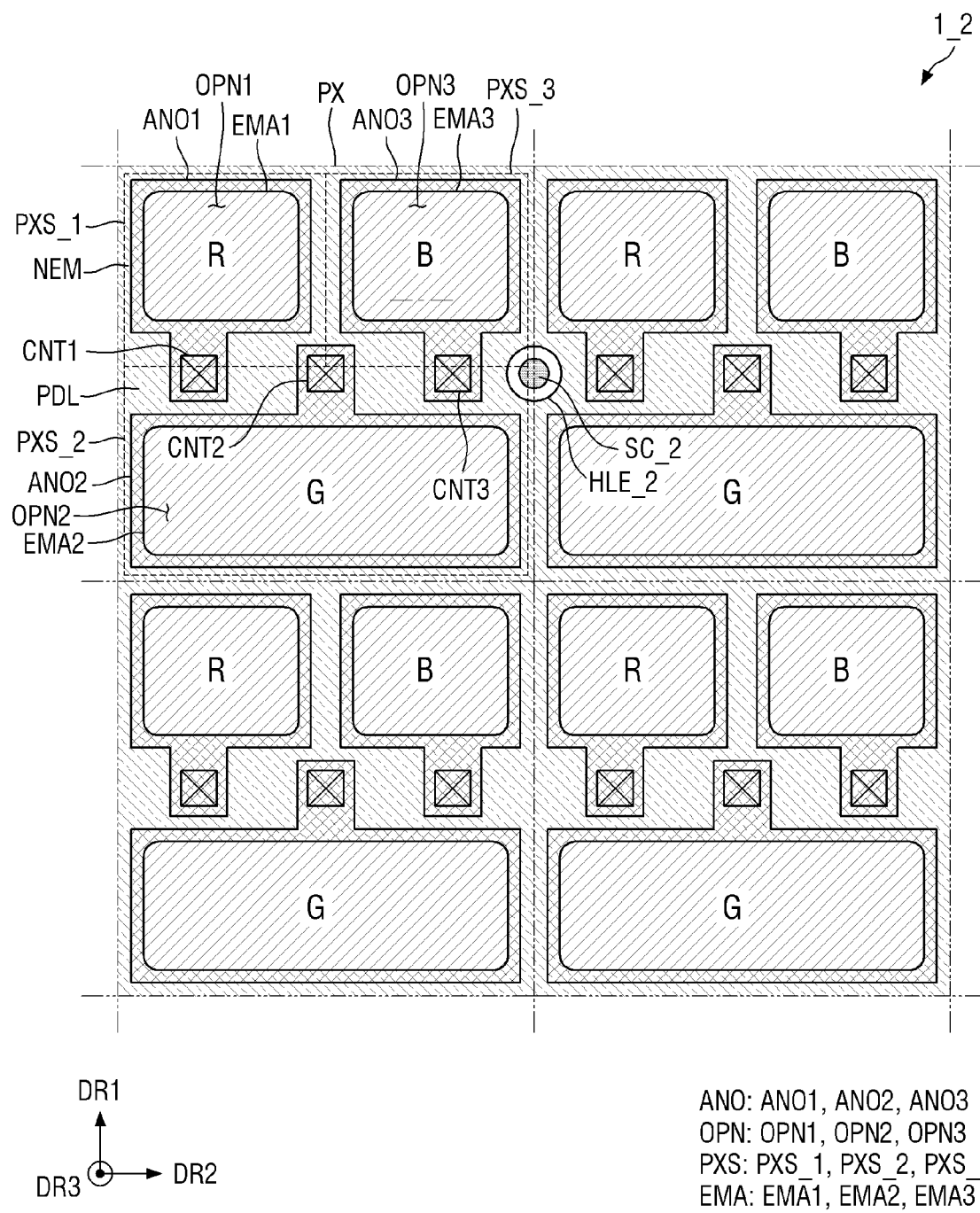
FIG. 13 is a schematic plan view showing an embodiment of a pixel arrangement of a display device.

FIG. 13 is a schematic plan view showing an embodiment of a pixel arrangement of a display device 1_2.

Referring to FIG. 13, a display device 1_2 is different from the embodiment of FIG. 3 in that a through hole HLE_2 (e.g., second through hole) defined by a pixel defining layer PDL and a spacer SC_2 (e.g., second spacer) which is disposed inside the through hole HLE_2 are disposed on a boundary between pixels PX which are adjacent to each other.

Specifically, the display device 1_2 includes the pixel defining layer PDL, the through hole HLE_2 defined by the pixel defining layer PDL, and the spacer SC_2 disposed inside the through hole HLE_2. The through hole HLE_2 and the spacer SC_2 may be disposed on the boundary of the pixels PX which are adjacent to each other. The through hole HLE_2 and the spacer SC_2 may be disposed between a third anode electrode pattern ANO3 of a first pixel among the pixels PX and a first anode electrode pattern ANO1 of a second pixel among the pixels PX which is adjacent to the first pixel. Further, the through hole HLE_2 and the spacer SC_2 may be disposed between a third contact hole CNT3 of the first pixel among the pixels PX and a first contact hole CNT1 of the second pixel among the pixels PX which is adjacent to the first pixel. Accordingly, a separation distance d (in FIG. 5) can be secured between the pixel defining layer PDL and the spacer SC_2.

The pixel defining layer PDL and the spacer SC_2 are spaced apart from each other, so that the liquid repellency of the pixel defining layer PDL can be maintained by providing the pixel defining layer PDL after the spacer SC_2 is provided. Further, where the pixel defining layer PDL is provided after the spacer SC_2 is provided, uniformity of the upper portion of the spacer SC is improved and the actual effective area ratio of the spacer SC is increased. In addition, since the separation distance d (in FIG. 5) between the pixel defining layer PDL and the spacer SC_2 is increased, defects of the pixel defining layer PDL and the spacer SC_2 is reduced while reliability of the display device 1_2 is improved.

Figure 14:
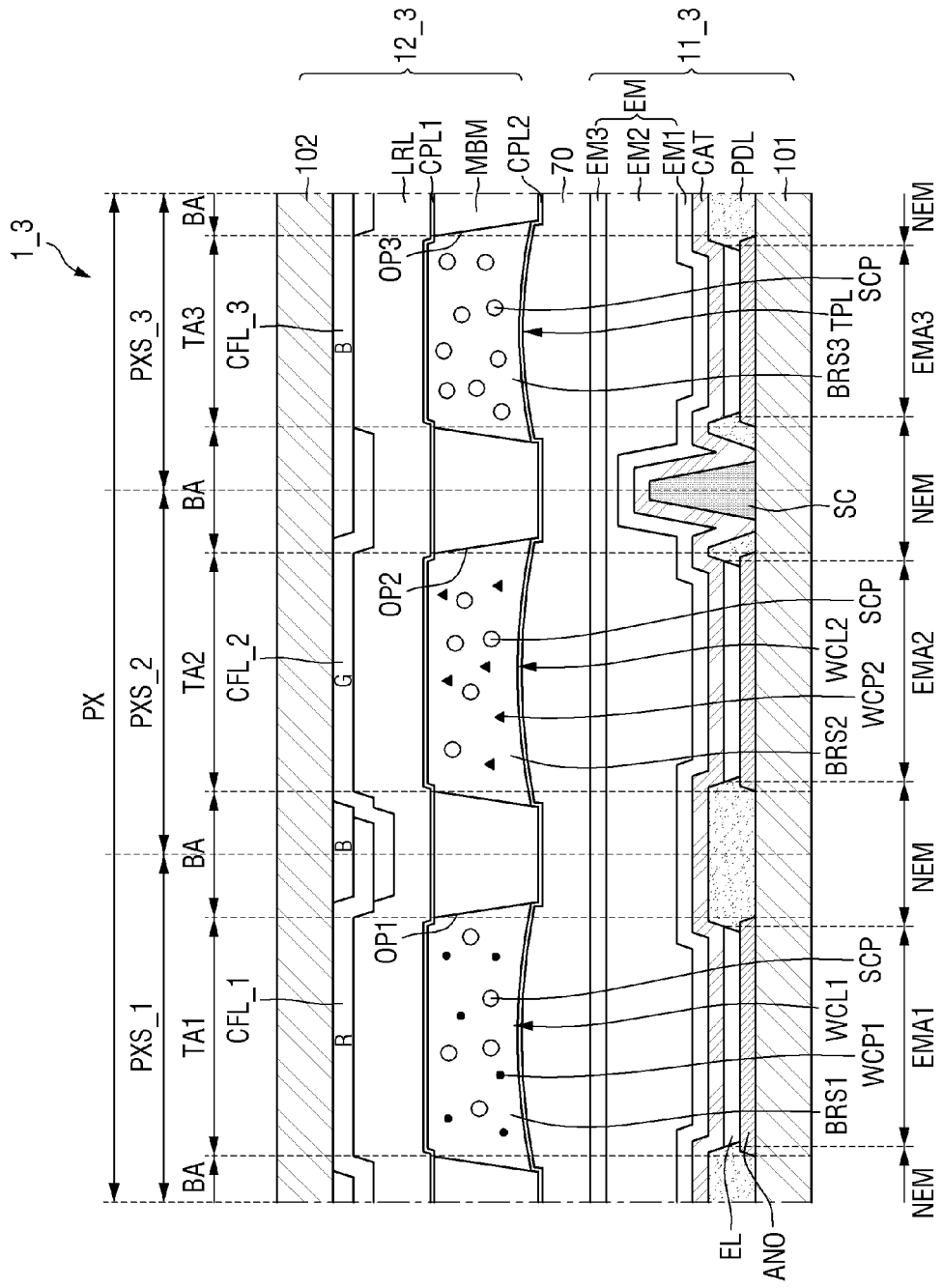
FIG. 14 is an enlarged cross-sectional view showing an embodiment of a pixel arrangement of a display device.

FIG. 14 is an enlarged cross-sectional view showing an embodiment of a pixel arrangement of a display device 1_3.

Referring to FIG. 14, a display device 1_3 is different from the embodiment of FIG. 4 in that the display device 1_3 further includes color control structures WCL1, WCL2 and TPL for converting a color of incident light.

Specifically, first, second and third sub-pixels PXS_1, PXS_2, and PXS_3 may include light exit areas TA1, TA2 and TA3, and a light blocking area BA provided in plural including light blocking areas BA therearound, respectively. The light exit areas TA1, TA2 and TA3 may be planar areas at which light emitted from the first, second and third emission areas EMA1, EMA2 and EMA3 is emitted to outside of the display device 1_3, respectively. The light exit areas TA1, TA2 and TA3 may be aligned with or overlap the first, second and third emission areas EMA1, EMA2 and EMA3, respectively. The light blocking areas BA do not allow the light emitted from the emission areas EMA to be emitted to the outside of the display device 1_3.

The display device 1_3 may include a first display substrate 11_3, a second display substrate 12_3 facing the first display substrate 11_3, and a filling layer 70 interposed between the first display substrate 11_3 and the second display substrate 12_3.

The first display substrate 11_3 may include elements and circuits (not shown) for displaying an image, a pixel defining layer PDL, a spacer SC, and a self-light emitting element, and the like, and may include the same components as those of the embodiment of FIG. 4. The light emitting layer EL may be provided in plural including light emitting layers EL which emit light of the same color (e.g., blue light), but the present disclosure is not limited thereto.

The first display substrate 11_3 may further include a thin film encapsulation layer EM disposed on the cathode electrode CAT to encapsulate a structure disposed therebelow. The thin film encapsulation layer EM may include a first inorganic encapsulation layer EM1, an organic encapsulation layer EM2, and a second inorganic encapsulation layer EM3 which may be sequential from the first substrate 101.

The second display substrate 12_3 may include color control structures WCL1, WCL2 and TPL disposed on the second substrate 102 to convert a color of incident light. The color control structures WCL1, WCL2 and TPL may control a wavelength of the incident light to convert the color of the incident light.

The second display substrate 12_3 may include a color filter layer including a first, second and third color filter CFL1, CFL2 and CFL3 for reducing or preventing the emission of light of a color different from the corresponding color of each of the first, second and third sub-pixels PXS_1, PXS_2 and PXS_3, a low refractive index layer LRL for recycling light, a first capping layer CPL1, a bank layer MBM distinguished by the sub-pixels PXS, wavelength converting layers WCL1 and WCL2 for converting the wavelength of the light emitted from a light emitting layer EL, a light transmitting layer TPL for directly transmitting the light emitted from the light emitting layer EL without color-conversion, and a second capping layer CPL2. The bank layer MBM may define first, second and third emission openings OP1, OP2 and OP3 from which color-controlled light is emitted from color control structures WCL1, WCL2 and TPL, respectively.

The wavelength converting layers WCL1 and WCL2 and the light transmitting layer TPL may respectively include base resins BRS1, BRS2 and BRS3, and a light scatterer SCP provided in plural including scatterers SCP for increasing wavelength conversion efficiency or controlling an emission angle by scattering light. The wavelength converting layers WCL1 and WCL2 may further include wavelength converting materials WCP1 and WCP2 for converting a wavelength of the light.

In the display device 1_3 which includes color control structures WCL1, WCL2 and TPL for converting a color of incident light, the pixel defining layer PDL and the spacer SC are spaced apart from each other, so that the liquid repellency of the pixel defining layer PDL can be maintained by providing the pixel defining layer PDL after the spacer SC is provided. Further, where the pixel defining layer PDL is provided after the spacer SC is provided, uniformity of the upper portion of the spacer SC is improved and the actual effective area ratio of the spacer SC is increased.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
   a substrate comprising a display area and a non-display area which is adjacent to the display area; and
   within the display area:
   an emission area provided in plural including emission areas;
   a non-emission area between the emission areas, the non-emission area including:
   a pixel defining layer defining a first opening,
   a spacer spaced apart from the pixel defining layer along the substrate, and
   the pixel defining layer and the spacer including different materials from each other, and
   each emission area including a light emitting element comprising:
   a first electrode exposed to outside the pixel defining layer by the first opening; and
   a light emitting layer in the first opening and facing the first electrode,
   wherein
   the pixel defining layer and the spacer each includes a top surface which is furthest from the substrate and a height of the top surface from the substrate, and
   the height of the top surface of the spacer is greater than the height of the top surface of the pixel defining layer.

2. The display device of claim 1, wherein the light emitting element further comprises a second electrode covering the top surface of the pixel defining layer, the light emitting layer and the top surface of the spacer.

3. The display device of claim 2, wherein
   the spacer further includes a side surface extended from the top surface of the spacer and toward the substrate, and
   the second electrode extends continuously from the top surface of the spacer to the top surface of the pixel defining layer to cover the side surface of the spacer.

4. The display device of claim 2, wherein
   the pixel defining layer further defines a second opening which is in the non-emission area and spaced apart from the first opening and the first electrode, and
   the spacer is in the second opening.

5. The display device of claim 4, further comprising a planarization layer between the substrate and the first electrode of the light emitting element,
   wherein
   the second opening exposes a first region of the planarization layer to outside the pixel defining layer, and
   the second electrode of the light emitting element continuously extends from top surface of the spacer to directly contact the first region of the planarization layer which is exposed to outside the pixel defining layer.

6. The display device of claim 4, wherein
   the second opening is spaced apart from the first opening by a distance, and
   the distance between the first opening and the second opening is greater than about 8 micrometers.

7. The display device of claim 1, wherein at the first opening, the pixel defining layer has liquid repellency and a contact angle with water which is within a range of more than about 90 degrees and less than about 180 degrees.

8. The display device of claim 1, wherein within the non-emission area, the spacer which has the height of the top surface greater than the height of the top surface of the pixel defining layer further has a contact angle with water which is smaller than a contact angle with water of the pixel defining layer.

9. The display device of claim 1, wherein within the non-emission area, the pixel defining layer and the spacer include different organic materials.

10. The display device of claim 1, wherein within the non-emission area:
    the pixel defining layer includes a negative sensitizer, and
    the spacer includes a positive sensitizer.

11. The display device of claim 1, further comprising:
a planarization layer between the substrate and the first electrode of the light emitting element, and
a sub-pixel defining layer between the planarization layer and the pixel defining layer,
wherein
the sub-pixel defining layer is exposed to outside the pixel defining layer by the first opening, and
at the first opening, the sub-pixel defining layer has a lyophilic property and a contact angle with water which is within a range of more than 0 degrees and less than about 90 degrees.

12. The display device of claim 1, wherein
each of the spacer and the pixel defining layer has a thickness, and
the thickness of the spacer is greater than the thickness of the pixel defining layer.

13. The display device of claim 12, wherein
the thickness of the spacer is within a range of about 1.6 micrometers to about 2.5 micrometers, and
the thickness of the pixel defining layer is within a range of about 1.0 micrometers to about 1.5 micrometers.

14. A display device comprising:
a substrate comprising a display area and a non-display area which is adjacent to the display area;
a semiconductor layer on the substrate;
a first insulating layer on the semiconductor layer;
a gate conductive layer on the first insulating layer;
a second insulating layer on the gate conductive layer;
a data conductive layer on the second insulating layer;
a planarization layer facing the substrate with each of the semiconductor layer, the first insulating layer, the gate conductive layer, the second insulating layer and the data conductive layer therebetween;
within the display area:
an emission area including a light emitting element comprising:
a pixel electrode; and
a light emitting layer facing the pixel electrode;
the emission area provided in plural including emission areas; and
a non-emission area between the emission areas, the non-emission area including:
a pixel defining layer defining both:
a first opening exposing the pixel electrode to outside the pixel defining layer, and
a second opening spaced apart from the first opening and the pixel electrode;
a spacer in the second opening and spaced apart from the pixel defining layer along the substrate; and
the pixel defining layer and the spacer including different materials from each other,
wherein
the pixel defining layer and the spacer each includes a top surface which is furthest from the substrate and a height of the top surface from the substrate, and
the height of the top surface of the spacer is greater than the height of the top surface of the pixel defining layer.

15. The display device of claim 14, wherein within the non-emission area:
the pixel defining layer includes a negative sensitizer, and
the spacer includes a positive sensitizer.

16. The display device of claim 14, further comprising a common electrode covering the light emitting layer, the top surface of the pixel defining layer and the top surface of the spacer.

17. The display device of claim 16, wherein
the spacer further includes a side surface extended from the top surface of the spacer and toward the substrate, and
the common electrode extends continuously from the top surface of the spacer to the top surface of the pixel defining layer to cover the side surface of the spacer.

18. An electronic device comprising:
a display device including a substrate comprising a display area and a non-display area which is adjacent to the display area; and
within the display area:
an emission area provided in plural including emission areas;
a non-emission area between the emission areas, the non-emission area including:
a pixel defining layer defining a first opening,
a spacer spaced apart from the pixel defining layer along the substrate, and
the pixel defining layer and the spacer including different materials from each other, and
each emission area including a light emitting element comprising:
a first electrode exposed to outside the pixel defining layer by the first opening; and
a light emitting layer in the first opening and facing the first electrode,
wherein
the pixel defining layer and the spacer each includes a top surface which is furthest from the substrate and a height of the top surface from the substrate, and
the height of the top surface of the spacer is greater than the height of the top surface of the pixel defining layer.

* * * * *